United States Patent
Butterfield

(10) Patent No.: US 10,573,358 B2
(45) Date of Patent: Feb. 25, 2020

(54) OUTPUT DRIVER FOR MULTI-LEVEL SIGNALING

(71) Applicant: Micron Technology, Inc., Boise, ID (US)

(72) Inventor: Justin D. Butterfield, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/514,348

(22) Filed: Jul. 17, 2019

(65) Prior Publication Data

US 2020/0013442 A1 Jan. 9, 2020

Related U.S. Application Data

(62) Division of application No. 15/868,797, filed on Jan. 11, 2018, now Pat. No. 10,403,337.

(Continued)

(51) Int. Cl.
*G11C 7/12* (2006.01)
*G11C 7/02* (2006.01)
(Continued)

(52) U.S. Cl.
CPC ............ *G11C 7/12* (2013.01); *G11C 7/02* (2013.01); *G11C 7/1069* (2013.01); *G11C 11/5642* (2013.01); *G11C 16/08* (2013.01); *G11C 16/26* (2013.01); *G11C 16/30* (2013.01); *H04L 25/028* (2013.01); *H04L 25/4917* (2013.01); *G11C 7/106* (2013.01)

(58) Field of Classification Search
CPC .............................. G11C 7/12; H04L 25/4917
USPC ..................................................... 365/189.11
See application file for complete search history.

(56) References Cited

U.S. PATENT DOCUMENTS 6,294,937 B1 9/2001 Crafts et al.
6,574,758 B1 6/2003 Eccles
(Continued)

FOREIGN PATENT DOCUMENTS

TW 201611031 A 3/2016
TW I530167 B 4/2016

OTHER PUBLICATIONS

IPO, "Office Action" issued in connection with Taiwan Patent Application No. 107127205 dated Apr. 23, 2019 (8 pages).

(Continued)

*Primary Examiner* — Harry W Byrne
(74) *Attorney, Agent, or Firm* — Holland & Hart LLP

(57) ABSTRACT

A driver of a multi-level signaling interface is provided. The driver may be configured reduce noise in a multi-level signal (e.g., a pulse amplitude modulation signal) generated by the driver using switching components of different polarities. The driver may include a pull-up circuit and/or a pull-down circuit. The pull-up circuit and the pull-down circuit may include at least one switching component of a first polarity (e.g., nmos transistor) and at least one switching component of a second polarity different from the first polarity (e.g., pmos transistor). Such a configuration of pull-up and pull down circuits may generate a more linear relationship between an output current and an output voltage of an output of the driver, thereby improving one or more characteristics of the multi-level signal.

9 Claims, 12 Drawing Sheets

Related U.S. Application Data

(60) Provisional application No. 62/542,163, filed on Aug. 7, 2017.

(51) Int. Cl.

| | | |
|---|---|---|
| G11C 7/10 | (2006.01) | |
| G11C 11/56 | (2006.01) | |
| G11C 16/30 | (2006.01) | |
| H04L 25/02 | (2006.01) | |
| H04L 25/49 | (2006.01) | |
| G11C 16/08 | (2006.01) | |
| G11C 16/26 | (2006.01) | |

(56) References Cited

U.S. PATENT DOCUMENTS

| | | |
|---|---|---|
| 7,126,378 B2 | 10/2006 | Stojanovic et al. |
| 7,269,212 B1 | 9/2007 | Chau et al. |
| 7,308,044 B2 | 12/2007 | Zerbe et al. |
| 7,308,058 B2 | 12/2007 | Zerbe et al. |
| 7,509,368 B2 | 3/2009 | Anders et al. |
| 7,598,762 B2 | 10/2009 | Byun et al. |
| 7,650,526 B2 | 1/2010 | Alon et al. |
| 7,692,447 B2 | 4/2010 | Cranford et al. |
| 7,714,615 B2 | 5/2010 | Liang et al. |
| 7,755,366 B2 | 7/2010 | Hosoe et al. |
| 7,853,846 B2 | 12/2010 | Cannon et al. |
| 7,961,008 B2 | 6/2011 | Kim et al. |
| 8,026,740 B2 | 9/2011 | Hollis |
| 8,049,530 B2 | 11/2011 | Batt |
| 8,072,253 B2 | 12/2011 | Kaeriyama et al. |
| 8,436,653 B2 | 5/2013 | Hollis |
| 8,570,789 B2 | 10/2013 | Chang |
| 8,604,828 B1 | 12/2013 | Bickford et al. |
| 8,669,792 B2 | 3/2014 | Rao |
| 8,781,022 B1 | 7/2014 | Chang et al. |
| 8,816,738 B2 | 8/2014 | Tatapudi et al. |
| 8,854,236 B2 | 10/2014 | Hollis |
| 9,048,824 B2 | 6/2015 | Chan et al. |
| 9,148,170 B2 | 9/2015 | Hollis |
| 9,203,662 B2 | 12/2015 | Hollis |
| 9,286,697 B2 | 3/2016 | Igarashi |
| 9,324,454 B2 * | 4/2016 | Hollis .................. G11C 29/36 |
| 9,337,807 B2 | 5/2016 | Hollis et al. |
| 9,444,455 B2 | 9/2016 | Bhuiyan et al. |
| 9,509,535 B2 | 11/2016 | Hollis |
| 9,525,573 B2 | 12/2016 | Fiedler |
| 9,577,854 B1 | 2/2017 | Hollis |
| 9,621,160 B2 | 4/2017 | Tang |
| 9,712,257 B1 | 7/2017 | Tan et al. |
| 9,755,620 B1 | 9/2017 | Lin et al. |
| 9,831,874 B1 | 11/2017 | Fortin et al. |
| 9,917,711 B2 | 3/2018 | Ulrich |
| 9,972,363 B2 | 5/2018 | Tang |
| 10,015,027 B2 | 7/2018 | Schober |
| 10,043,557 B1 | 8/2018 | Hollis |
| 2002/0136343 A1 | 9/2002 | Cranford et al. |
| 2002/0149402 A1 | 10/2002 | Martin et al. |
| 2003/0161393 A1 | 8/2003 | Ahn |
| 2004/0085841 A1 | 5/2004 | Lim et al. |
| 2005/0258870 A1 | 11/2005 | Mitby et al. |
| 2006/0091901 A1 | 5/2006 | Kim |
| 2006/0091911 A1 | 5/2006 | Rho |
| 2006/0290439 A1 | 12/2006 | Martin et al. |
| 2007/0136621 A1 | 6/2007 | Alon et al. |
| 2008/0129348 A1 | 6/2008 | Shau |
| 2008/0144411 A1 | 6/2008 | Tsern |
| 2009/0072860 A1 | 3/2009 | Lee |
| 2012/0092057 A1 | 4/2012 | Yu |
| 2013/0100737 A1 | 4/2013 | Kwak |
| 2013/0113521 A1 | 5/2013 | Song |
| 2013/0248801 A1 | 9/2013 | Yamamoto |
| 2014/0003549 A1 | 1/2014 | Won et al. |
| 2014/0176196 A1 | 6/2014 | Li et al. |
| 2014/0226734 A1 | 8/2014 | Fox et al. |
| 2015/0071651 A1 | 3/2015 | Asmanis et al. |
| 2015/0104196 A1 | 4/2015 | Bae et al. |
| 2015/0171829 A1 | 6/2015 | Song et al. |
| 2015/0187441 A1 * | 7/2015 | Hollis .................. G11C 29/36 |
| | | 714/719 |
| 2016/0087819 A1 | 3/2016 | Poulton |
| 2016/0119169 A1 | 4/2016 | Schober |
| 2016/0180897 A1 | 6/2016 | Shen et al. |
| 2016/0181950 A1 | 6/2016 | Yoscovich et al. |
| 2016/0189775 A1 | 6/2016 | Buchanan |
| 2016/0224243 A1 | 8/2016 | Son et al. |
| 2016/0301393 A1 | 10/2016 | Jung |
| 2016/0374091 A1 | 12/2016 | Saeki |
| 2016/0378597 A1 | 12/2016 | Chung et al. |
| 2017/0054656 A1 | 2/2017 | Luo et al. |
| 2017/0060803 A1 | 3/2017 | Shim |
| 2017/0075757 A1 | 3/2017 | Im et al. |
| 2017/0118048 A1 | 4/2017 | Ulrich |
| 2017/0141025 A1 | 5/2017 | Lee |
| 2017/0212695 A1 | 7/2017 | Hollis et al. |
| 2017/0222845 A1 | 8/2017 | Zerbe et al. |
| 2017/0337979 A1 | 11/2017 | Lee et al. |
| 2018/0123593 A1 | 5/2018 | Choi |
| 2018/0278440 A1 | 9/2018 | Dong |
| 2019/0043543 A1 | 2/2019 | Butterfield |
| 2019/0044762 A1 | 2/2019 | Lin |
| 2019/0044764 A1 | 2/2019 | Hollis et al. |
| 2019/0044766 A1 | 2/2019 | Lin et al. |
| 2019/0044769 A1 | 2/2019 | Hollis |

OTHER PUBLICATIONS

IPO, "Office Action," issued in connection with Taiwan Patent Application No. 107127204, dated May 29, 2019 (9 pages).

ISA/KR, International Search Report and Written Opinion of the International Searching Authority, Int'l. Appl. No. PCT/US2018/044381, dated Nov. 8, 2018, 15 pgs.

ISA/KR, International Search Report and Written Opinion of the International Searching Authority, Int'l. Appl. No. PCT/US2018/043311, Oct. 31, 2018, Korean Intellectual Property Office, Seo-gu, Daejeon, Republic of Korea, 12 pgs.

ISA/KR, International Search Report and Written Opinion of the International Searching Authority, Int'l. Appl. No. PCT/US2018/043648, Nov. 7, 2018, Korean Intellectual Property Office, Seo-gu, Daejeon, Republic of Korea, 14 pgs.

ISA/KR, International Search Report and Written Opinion of the International Searching Authority, Int'l. Appl. No. PCT/US2018/044377, Nov. 8, 2018, Korean Intellectual Property Office, Seo-gu, Daejeon, Republic of Korea, 15 pgs.

ISA/KR, International Search Report and Written Opinion of the International Searching Authority, Int'l. Appl. No. PCT/US2018/044411, Nov. 14, 2018, Korean Intellectual Property Office, Seo-gu, Daejeon, Republic of Korea, 15 pgs.

Nadeesha Amarasinghe "A Single-ended Simultaneously Bidirectional Transceiver for Ultra-short Reach Die to Die Links" Master of Applied Science Graduate Department of Electrical and Computer Engineering, University of Toronto, 2016, 79pgs.

* cited by examiner

OUTPUT DRIVER FOR MULTI-LEVEL SIGNALING

CROSS REFERENCE

The present Application for Patent is a divisional of U.S. patent application Ser. No. 15/868,797 by Butterfield, entitled "Output Driver For Multi-Level Signaling," filed Jan. 11, 2018, which claims priority to U.S. Provisional Patent Application No. 62/542,163 by Butterfield, entitled "Output Driver For Multi-Level Signaling," filed Aug. 7, 2017, assigned to the assignee hereof, and each of which is expressly incorporated by reference herein.

BACKGROUND

The following relates generally to output drivers in a memory device and more specifically to an output driver for multi-level signaling.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Some memory devices may use multi-level signaling to communicate data between components (e.g., high-bandwidth memory). For example, a pulse amplitude modulation (PAM) scheme such as PAM4 may be used to encode data into a signal. Some multi-level signals are more sensitive to noise than a binary-level signal because the margins between amplitude levels may be less. In addition, some noise may be introduced into a multi-level signal by a non-linear response of switching components of the driver over the range of output values.

A driver of a multi-level signaling interface is provided. The driver may be configured reduce noise in a multi-level signal (e.g., a pulse amplitude modulation signal) generated by the driver using switching components of different polarities. The driver may include a pull-up circuit and/or a pull-down circuit. The pull-up circuit and the pull-down circuit may include at least one switching component of a first polarity (e.g., nmos transistor) and at least one switching component of a second polarity different from the first polarity (e.g., pmos transistor). Such a configuration of pull-up and pull down circuits may generate a more linear relationship between an output current and an output voltage of an output of the driver, thereby improving one or more characteristics of the multi-level signal.

Features of the disclosure introduced above are further described below in the context of a memory device. Specific examples are then described for a memory device that supports an output driver for multi-level signaling. These and other features of the disclosure are further illustrated by and described with reference to apparatus diagrams, system diagrams, and flowcharts that relate to multi-level signaling.

Figure 1:
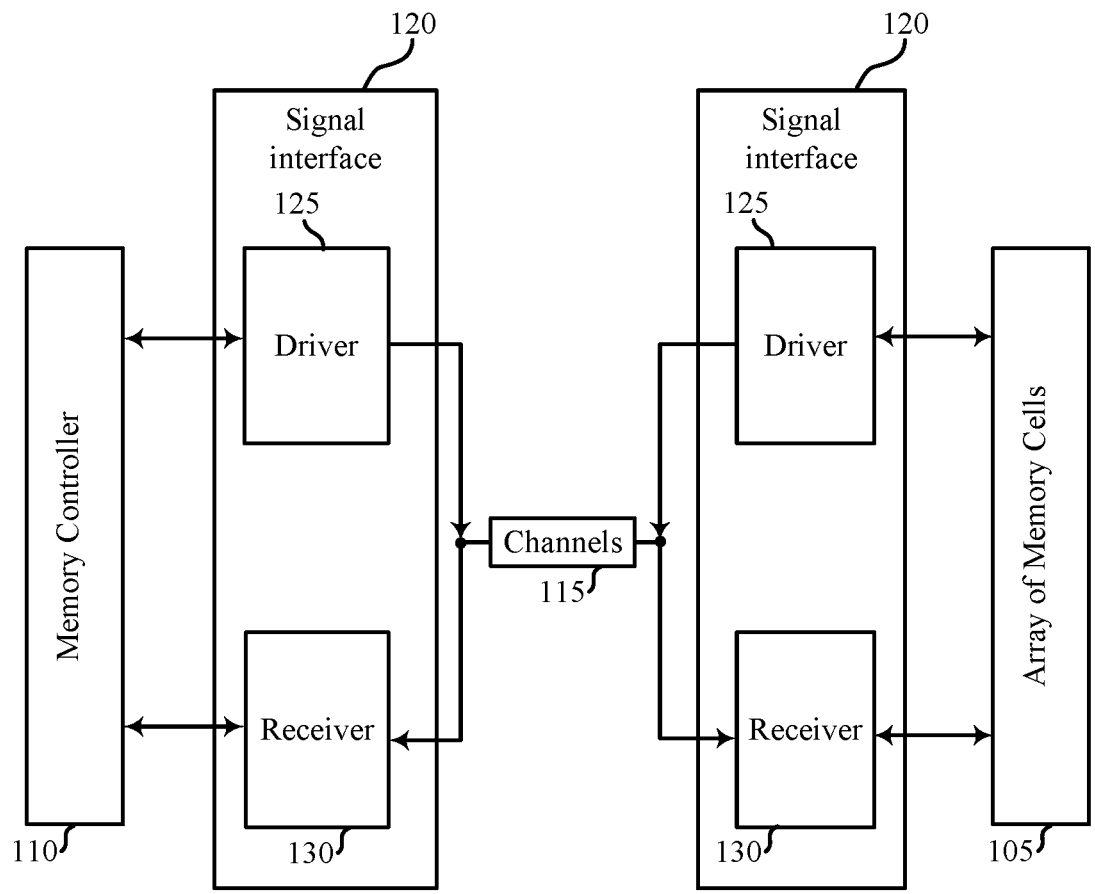
FIG. 1 illustrates an example of a memory device that supports an output driver for multi-level signaling in accordance with embodiments of the present disclosure.

FIG. 1 illustrates an example memory device 100 in accordance with various examples of the present disclosure. The memory device 100 may also be referred to as an electronic memory apparatus. The memory device 100 may be configured to utilize multi-level signaling to communicate data between various components of the memory device 100. Some examples of the multi-level signaling may include PAM signaling such as PAM4 signaling, PAM8 signaling, etc. The memory device 100 may include an array of memory cells 105, a controller 110, a plurality of channels 115, signaling interfaces 120, other components, or a combination thereof.

A memory device 100 may use multi-level signaling to increase an amount of information transmitted using a given bandwidth of frequency resources. In binary signaling, two symbols of a signal (e.g., two voltages levels) are used to represent up to two logic states (e.g., logic state '0' or logic state '1'). In multi-level signaling, a larger library of symbols may be used to represent data. Each symbol may represent more than two logic states (e.g., logic states with multiple bits). For example, if the signal is capable of four unique symbols, the signal may be used to represent up to four logic states (e.g., '00', '01', '10', and '11'). As a result, multiple bits of data may be compressed into a single symbol, thereby increasing the amount of data communicated using a given bandwidth.

In some cases of multi-level signaling, the amplitude of the signal may be used to generate the different symbols. For example, a first amplitude level may represent '00', a second amplitude level may represent '01', a third amplitude level may represent '10', and a fourth amplitude level may represent '11'. One drawback of some multi-level signaling schemes is that the symbols may be separated by a smaller voltage than symbols in a binary signaling scheme. The smaller voltage separation may make the multi-level signaling scheme more susceptible to errors caused by noise or other aspects. The voltage separation of symbols in the multi-level signaling scheme, however, may be expanded by increasing a peak-to-peak transmitted power of a transmitted signal. In some situations, however, such an increase to peak-to-peak transmitted power may not be possible or may be difficult due to fixed power supply voltages, fixed signal power requirements, or other factors. Consequently, to implement multi-level signaling a transmitter may utilize more power and/or a receiver may be susceptible to an increased error rate, when compared to a binary signaling scheme.

A multi-level signal (sometimes referred to as a multi-symbol signal) may be a signal that is modulated using a modulation scheme that includes three or more unique symbols to represent data (e.g., two or more bits of data). The multi-level signal may be an example of an M-ary signal that is modulated using a modulation scheme where M is greater than or equal to three, where M represents the number of unique symbols, levels, or conditions possible in the modulation scheme. A multi-level signal or a multi-level modulation scheme may be referred to as a non-binary signal or non-binary modulation scheme in some instances. Examples of multi-level (or M-ary) modulation schemes related to a multi-level signal may include, but are not limited to, pulse amplitude modulation (e.g., PAM4, PAM8), quadrature amplitude modulation (QAM), quadrature phase shift keying (QPSK), and/or others.

A binary-level signal (sometimes referred to as a binary-symbol signal) may be a signal that is modulated using a modulation scheme that includes two unique symbols to represent one bit of data. The binary-level signal may be an example of an M-ary modulation scheme where M is less than or equal to 2. Examples of binary-level modulation schemes related to a binary-level signal include, but are not limited to, non-return-to-zero (NRZ), unipolar encoding, bipolar encoding, Manchester encoding, PAM2, and/or others.

Each memory cell of the array of memory cells 105 may be programmable to store different states. For example, each memory cell may be programmed to store two or more logic states (e.g., a logic '0', a logic '1', a logic '00', a logic '01', a logic '10', a logic '11', etc.). A memory cell may store a charge representative of the programmable states in a capacitor; for example, a charged and uncharged capacitor may represent two logic states, respectively. The memory cells of the array of memory cells 105 may use any number of storage mediums including DRAM, FeRAM, PCM, or other types of memory cells. A DRAM memory cell may include a capacitor with a dielectric material as the insulating material. For example, the dielectric material may have linear or para-electric electric polarization properties and a ferroelectric memory cell may include a capacitor with a ferroelectric material as the insulating material. In instances where the storage medium includes FeRAM, different levels of charge of a ferroelectric capacitor may represent different logic states.

The array of memory cells 105 may be or include a three-dimensional (3D) array, where multiple two-dimensional (2D) arrays or multiple memory cells are formed on top of one another. Such a configuration may increase the number of memory cells that may be formed on a single die or substrate as compared with 2D arrays. In turn, this may reduce production costs or increase the performance of the memory array, or both. Each level of the array may be aligned or positioned so that memory cells may be approximately aligned with one another across each level, forming a memory cell stack.

In some examples, the array of memory cells 105 may include a memory cell, a word line, a digit line, and a sense component. In some examples, the array of memory cells 105 may include a plate line (e.g., in the case of FeRAM). A memory cell of the array of memory cells 105 may include a selection component and a logic storage component, such as capacitor that includes a first plate, a cell plate, a second plate, and a cell bottom. The cell plate and cell bottom may be capacitively coupled through an insulating material (e.g., dielectric, ferroelectric, or PCM material) positioned between them.

The memory cell of the array of memory cells 105 may be accessed (e.g., during a read operation, write operation, or other operation) using various combinations of word lines, digit lines, and/or plate lines. In some cases, some memory cells may share access lines (e.g., digit lines, word lines, plate lines) with other memory cells. For example, a digit line may be shared with memory cells in a same column, a word line may be shared with memory cells in a same row, and a plate line may be shared with memory cells in a same section, tile, deck, or multiple decks. As described above, various states may be stored by charging or discharging the capacitor of the memory cell.

The stored state of the capacitor of the memory cell may be read or sensed by operating various elements. The capacitor may be in electronic communication with a digit line. The capacitor may be isolated from digit line when selection component is deactivated, and capacitor can be connected to digit line when selection component is activated (e.g., by the word line). Activating selection component may be referred to as selecting a memory cell. In some cases, the selection component may be a transistor and its operation may be controlled by applying a voltage to the transistor gate, where the voltage magnitude is greater than the threshold magnitude of the transistor. The word line may activate the selection component; for example, a voltage applied to a transistor gate of a word line may connect a capacitor of a memory cell with a digit line.

The change in voltage of a digit line may, in some examples, depend on its intrinsic capacitance. That is, as charge flows through the digit line, some finite charge may be stored in the digit line and the resulting voltage depends on the intrinsic capacitance. The intrinsic capacitance may depend on physical characteristics, including the dimensions, of the digit line. The digit line may connect many memory cells of the array of memory cells 105 so digit line may have a length that results in a non-negligible capacitance (e.g., on the order of picofarads (pF)). The resulting voltage of the digit line may then be compared to a reference voltage (e.g., a voltage of a reference line) by a sense component in order to determine the stored logic state in the memory cell. Other sensing processes may be used.

The sense component may include various transistors or amplifiers to detect and amplify a difference in signals, which may be referred to as latching. The sense component may include a sense amplifier that receives and compares the voltage of the digit line and a reference line, which may be a reference voltage. The sense amplifier output may be driven to the higher (e.g., a positive) or lower (e.g., negative or ground) supply voltage based on the comparison. For instance, if the digit line has a higher voltage than reference line, then the sense amplifier output may be driven to a positive supply voltage.

In some cases, the sense amplifier may drive the digit line to the supply voltage. The sense component may then latch the output of the sense amplifier and/or the voltage of the digit line, which may be used to determine the stored state in the memory cell (e.g., logic '1'). Alternatively, for example, if the digit line has a lower voltage than reference line, the sense amplifier output may be driven to a negative or ground voltage. The sense component may similarly latch the sense amplifier output to determine the stored state in the memory cell (e.g., logic '0'). The latched logic state of the memory cell may then be output, for example, through a column decoder.

To write a memory cell, a voltage may be applied across the capacitor of the memory cell. Various methods may be used to write a memory cell. In one example, the selection component may be activated through a word line in order to electrically connect the capacitor to the digit line. A voltage may be applied across the capacitor by controlling the voltage of the cell plate (e.g., through a plate line) and the cell bottom (e.g., through a digit line). To write a logic '0', the cell plate may be taken high (e.g., a voltage level may be increased above a predetermined voltage that is a "high" voltage). That is, a positive voltage may be applied to plate line, and the cell bottom may be taken low (e.g., virtually grounding or applying a negative voltage to the digit line). The opposite process may be performed to write a logic '1', where the cell plate is taken low and the cell bottom is taken high.

The controller 110 may control the operation (e.g., read, write, re-write, refresh, decharge, etc.) of memory cells in the array of memory cells 105 through the various components (e.g., row decoders, column decoders, and sense components). In some cases, one or more of the row decoder, column decoder, and sense component may be co-located with the controller 110. Controller 110 may generate row and column address signals in order to activate the desired word line and digit line. In other examples, controller 110 may generate and control various voltages or currents used during the operation of memory device 100. For example, controller 110 may apply discharge voltages to a word line or digit line after accessing one or more memory cells. In general, the amplitude, shape, or duration of an applied voltage or current discussed herein may be adjusted or varied and may be different for the various operations discussed in operating the memory device 100. Furthermore, one, multiple, or all memory cells within the array of memory cells 105 may be accessed simultaneously. For example, multiple memory cells or all memory cells of the array of memory cells 105 may be accessed simultaneously during a reset operation in which multiple memory cells or all memory cells may be set to a single logic state (e.g., logic '0').

Each of the plurality of channels 115 may be configured to couple the array of memory cells 105 with the controller 110. In some examples, each of the plurality of channels 115 may be referred to as a plurality of legs. In some memory devices, the rate of data transfer between the memory device and a host device (e.g., a personal computer or other computing device) may be limited by the rate of data transferred across the plurality of channels 115. In some examples, the memory device 100 may include a large number of high-resistance channels. By increasing the number of channels, the amount of data transferred in the memory device 100 may be increased without increasing the data rate of the transfer. In some examples, the plurality of channels 115 may be referred to as a wide system interface. Each of the plurality of channels 115 may be part of an interposer positioned between the array of memory cells 105 and the controller 110. In some examples, one or more of the channels 115 may be unidirectional and in other examples, one or more of the channels 115 may be bidirectional.

In some examples, at least some (and in some cases, each) of the signaling interfaces 120 may generate and/or decode signals communicated using the plurality of channels 115. A signaling interface 120 may be associated with each component that is coupled with the plurality of channels 115. The signaling interface 120 may be configured to generate and/or decode multi-level signals, binary signals, or both (e.g., simultaneously). Each signaling interface 120 may include a driver 125 and a receiver 130. In some examples, each driver 125 may be referred to as a multi-leg driver.

Each driver 125 may be configured to generate a multi-level signal based on a logic state that includes multiple bits. For example, driver 125 may use PAM4 signaling techniques (or other type of multi-level signaling techniques) to generate a signal having an amplitude that corresponds to the logic state. The driver 125 may be configured to receive data using a single input line. In some cases, the driver 125 may include a first input line for a first bit of data (e.g., most-significant bit), a second input line for a second bit of data (e.g., least-significant bit). In some circumstances, the driver 125 may be configured to generate a binary-level signal (e.g., a NRZ signal). In some cases, the driver 125 may use single-ended signaling to generate the multi-level signal. In such cases, the multi-level signal may be transmitted without a differential.

Each receiver 130 may be configured to determine a logic state represented by a symbol of the multi-level signal received using the plurality of channels 115. In some cases, the receiver 130 may determine an amplitude of the received multi-level signal. Based on the determined amplitude, the receiver 130 may determine the logic state represented by the multi-level signal. The receiver 130 may be configured to output data using a single output line. In some cases, the receiver 130 may include a first output line for a first bit of data (e.g., most-significant bit), a second output line for a second bit of data (e.g., least-significant bit). In some circumstances, the receiver 130 may be configured to decode a binary-level signal (e.g., a NRZ signal). For example, each of receivers 130 may be coupled with a transmitter (not illustrated) via a plurality of channels 115. Each of the channels 115 may be configured to output data that includes multiple bits, and the controller 110 may be configured to determine an output impedance offset between the data output. One or more transistors (not separately illustrated) may be configured to adjust a resistance level one or more of the pluralities of channels 115. This adjustment may be based at least in part on the determined output impedance offset.

The receiver 130 may be configured to receive and/or decode a multi-level signal or a binary-level signal. For example, the receiver 130 of a connected component (e.g., an array of memory cells 105 or a controller 110 of a memory device 100) may receive a signal using one or more plurality of channels (e.g., channels 115). The receiver 130 may be configured to output one or more bits of data based on a received signal. The receiver 130 may include one or more comparators and a decoder.

The one or more comparators may be configured to compare the received signal to one or more reference voltages. The number of comparators may be related to a number of symbols (e.g., amplitude levels) that may be represented in the received signal. For example, if the received signal is a multi-level signal configured to have four symbols (e.g., a PAM4 signal), the receiver 130 may include three comparators and three reference voltages.

Each comparator may output a signal based on whether the received signal is greater than or less than the reference voltage. Said another way, the comparator may determine whether received signal satisfies a voltage threshold defined by the comparator and its associated reference voltage. For example, the comparator may output a high voltage if the received signal is greater than the associated reference signal and the comparator may output a low voltage if the received signal is less than the associated reference signal (or vice-versa). The decoder may receive the outputs of the comparators. The reference voltages may be selected to discriminate between the expected amplitude levels of the received signal. For example, reference voltages may be selected to be within an eye opening 245 of an eye in an eye diagram between two amplitude levels (e.g., amplitudes 205-a and 205-b).

The decoder may be configured to determine a logic state represented by a symbol of the received signal based on the outputs of the comparators. The combination of the outputs of the comparators may be used to determine an amplitude of the received signal. In some cases, the decoder may be an example of a look-up table that indexes the outputs of the comparators to logic states of the received signal.

In some examples, if the received signal is less than all of the reference voltages, the decoder may determine that a logic state '00' is represented by a symbol of the received signal. If the received signal is greater than one reference voltage but less than two of the reference voltages, the decoder may determine that a logic state '01' is represented by a symbol of the received signal. If the received signal is greater than two of the reference voltages but less than one of the reference voltages, the decoder may determine that a logic state '10' is represented by a symbol of the received signal. If the received signal is greater than all of the reference voltages, the decoder may determine that a logic state '11' is represented by a symbol of the received signal. It should be appreciated that the mapping of logic states to amplitudes may be modified based on design choices.

In some cases, the receiver 130 may be configured to selectively decode binary signals (e.g., NRZ signaling) or multi-level signals (e.g., PAM4 or PAM8). In some cases, the receiver 130 or a connected component may be configured to select one or more channels or one or more groups of channels to listen for the received signal from another component of the memory device.

In some cases, each of the signaling interfaces 120 may be configured to selectively generate and/or decode different types of signals (e.g., NRZ signals, PAM4 signals, PAM8 signals, etc.). Different types of signals may be used based on the operational circumstances of the memory device 100. For example, binary signaling may use less power than multi-level signaling and may be used when power consumption is driving consideration for performance. Other performance factors that may be used to determine which type of signaling should be used may include clock considerations, data strobe (DQS) considerations, circuit capabilities, bandwidth considerations, jitter considerations, or combinations thereof. In some cases, the controller 110 may be configured to select the type of signal, and the signaling interfaces 120 may be configured to implement the selection based on instructions received from the controller 110. In some cases, each of the signaling interfaces 120 may be configured to implement coding functions such as error detection procedures, error correction procedures, data bus inversion procedures, or combinations thereof.

In some cases, the signaling interfaces 120 may be configured to communicate multi-level signals and binary signals simultaneously. In such cases, a signaling interface 120 may include more than one set of drivers 125 and receivers 130. For example, a signaling interface 120 may be configured to communicate a first set of data (e.g., a control signal) using a binary-level signal using a first set of channels 115 at the same time that a second set of data (e.g., user information) is being communicated using a multi-level signal using a second set of channels 115.

Figure 2:
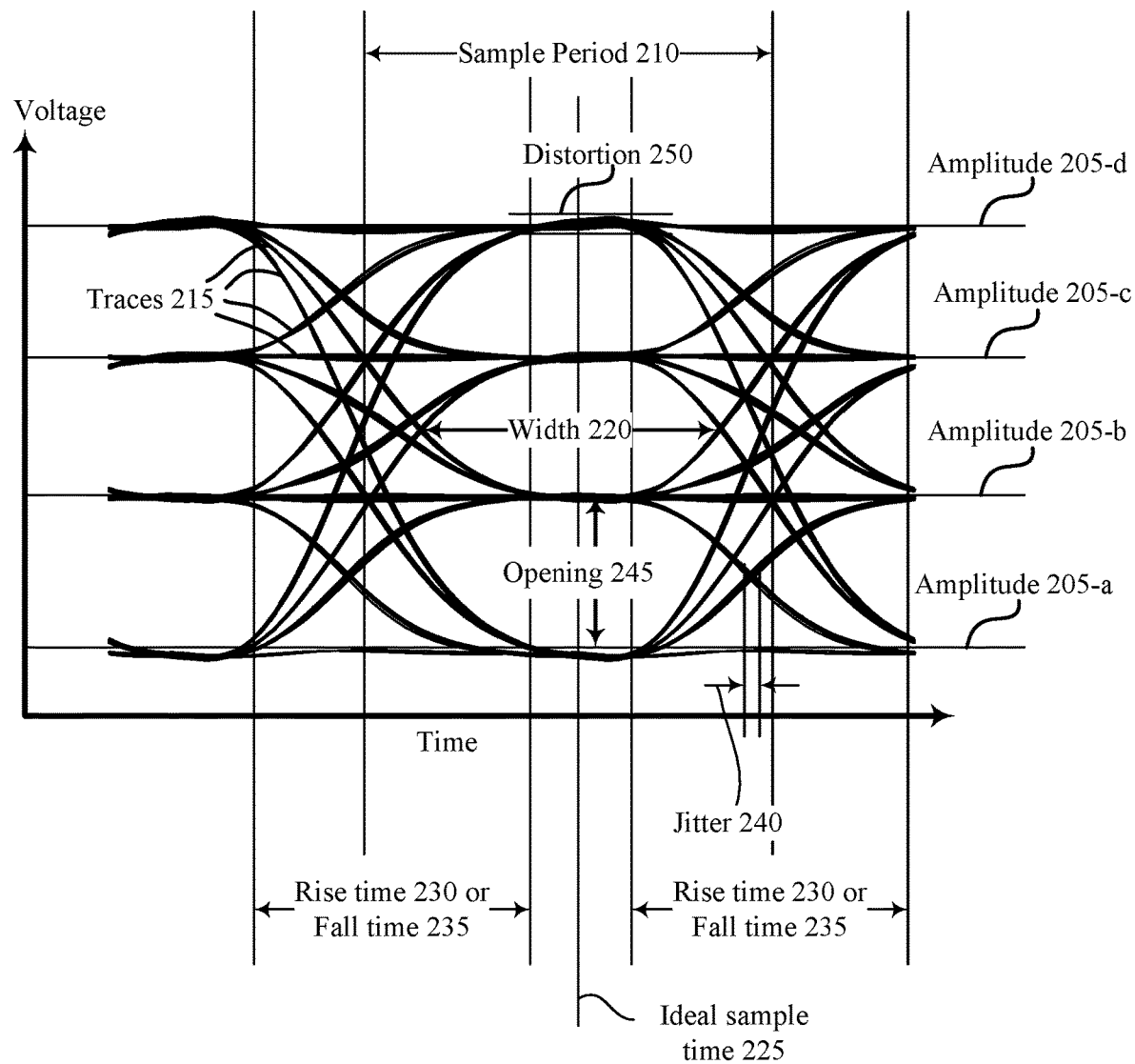
FIG. 2 illustrates an example of an eye diagram that supports an output driver for multi-level signaling in accordance with embodiments of the present disclosure.

FIG. 2 illustrates an example of an eye diagram 200 representing a multi-level signal in accordance with various embodiments of the present disclosure. The eye diagram 200 may be used to indicate the quality of signals in high-speed transmissions and may represent four symbols of a signal (e.g., '00', '01', '10', or '11'). In some examples, each of the four symbols may be represented by a different voltage amplitude (e.g., amplitudes 205-a, 205-b, 205-c, 205-d). In other examples, the eye diagram 200 may represent a PAM4 signal that may be used to communicate data in a memory device (e.g., memory device 100 as described with reference to FIG. 1). The eye diagram 200 may be used to provide a visual indication of the health of the signal integrity, and may indicate noise margins of the data signal. The noise margin may, for example, refer to an amount by which the signal exceeds the ideal boundaries of the amplitudes 205.

To generate the eye diagram 200, an oscilloscope or other computing device may sample a digital signal according to a sample period 210 (e.g., a unit interval or a bit period). The sample period 210 may be defined by a clock associated with the transmission of the measured signal. In some examples, the oscilloscope or other computing device may measure the voltage level of the signal during the sample period 210 to form a trace 215. Noise and other factors can result in the traces 215 measured from the signal deviating from a set of ideal step functions. By overlaying a plurality of traces 215, various characteristics about the measured signal may be determined. For example, the eye diagram 200 may be used to identify a number of characteristics of a communication signals such as jitter, cross talk, electromagnetic interference (EMI), signal loss, signal-to-noise ratio (SNR), other characteristics, or combinations thereof. A closed eye may indicate a noisy and/or unpredictable signal.

In some examples, the eye diagram 200 may indicate a width 220. The width 220 of an eye in the eye diagram 200 may be used to indicate a timing synchronization of the measured signal or jitter effects of the measured signal. In some examples, comparing the width 220 to the sample period 210 may provide a measurement of SNR of the measured signal. Each eye in an eye diagram may have a unique width based on the characteristics of the measured signal. Various encoding and decoding techniques may be used to modify the width 220 of the measured signal.

In other examples, the eye diagram 200 may indicate an ideal sampling time 225 for determining the value of a logic state represented by a symbol of the measured signal. For example, determining a correct time for sampling data (e.g., timing synchronization) of the measured signal may be important to minimize the error rate in detection of the signal. For example, if a computing device samples a signal during a transition time (e.g., a rise time 230 or a fall time 235), many errors may be introduced by the decoder into the data represented by a symbol of the signal. Various encoding and decoding techniques may be used to modify the ideal sampling time 225 of the measured signal.

The eye diagram 200 may be used to identify a rise time 230 and/or a fall time 235 for transitions from a first amplitude 205 to a second amplitude 205. The slope of the trace 215 during the rise time 230 or fall time 235 may indicate the signal's sensitivity to timing error. For example, the steeper the slope of the trace 215 (e.g., the smaller the rise time 230 and/or the fall time 235), the more ideal the transitions between amplitudes 205 are. Various encoding and decoding techniques may be used to modify the rise time 230 and/or fall time 235 of the measured signal.

In some examples, the eye diagram 200 may be used to identify an amount of jitter 240 in the measured signal. Jitter 240 may refer to a timing error that results from a misalignment of rise and fall times. Jitter 240 occurs when a rising edge or falling edge occurs at a time that is different from an ideal time defined by the data clock. Jitter 240 may be caused by signal reflections, intersymbol interference, crosstalk, process-voltage-temperature (PVT) variations, random jitter, additive noise, or combinations thereof. Various encoding and decoding techniques may be used to modify the jitter 240 of the measured signal. In some cases, the jitter 240 for each signal level or each eye may be different.

In other examples, the eye diagram 200 may indicate an eye opening 245, which may represent a peak-to-peak voltage difference between the various amplitudes 205. The eye opening 245 may be related to a voltage margin for discriminating between different amplitudes 205 of the measured signal. The smaller the margin, the more difficult it may be to discriminate between neighboring amplitudes, and the more errors that may be introduced due to noise. In some cases, a receiver (e.g., receiver 130 as described with reference to FIG. 1) of the signal may compare the signal to one or more threshold voltages positioned between the various amplitudes 205. In other cases, the larger the eye opening 245, the less likely it is that noise will cause the one or more voltage thresholds to be satisfied in error. The eye opening 245 may be used indicate an amount of additive noise in the measured signal, and may be used to determine a SNR of the measured signal. Various encoding and decoding techniques may be used to modify the eye opening 245 of the measured signal. In some cases, the eye opening 245 for each eye may be different. In such cases, the eyes of the multi-level signal may not be identical.

In other examples, the eye diagram 200 may indicate distortion 250. The distortion 250 may represent overshoot and/or undershoot of the measured signal due to noise or interruptions in the signal path. As a signal settles into a new amplitude (e.g., amplitude 205-$b$) from an old amplitude (e.g., an amplitude 205-$c$), the signal may overshoot and/or undershoot the new amplitude level. In some examples, distortion 250 may be caused by this overshooting and/or undershooting, and may be caused additive noise in the signal or interruptions in the signal path. Each eye in an eye diagram may have a unique opening based on the characteristics of the measured signal. Various encoding and decoding techniques may be used to modify the distortion 250 of the measured signal. In some cases, the distortion 250 for each signal level or each eye may be different.

The locations of the characteristics of the eye diagram 200 shown in FIG. 2 are for illustrative purposes only. Characteristics such as width 220, sampling time 225, rise time 230, fall time 235, jitter 240, eye opening 245, and/or distortion 250 may occur in other parts of the eye diagram 200 not specifically indicated in FIG. 2.

Figure 3:
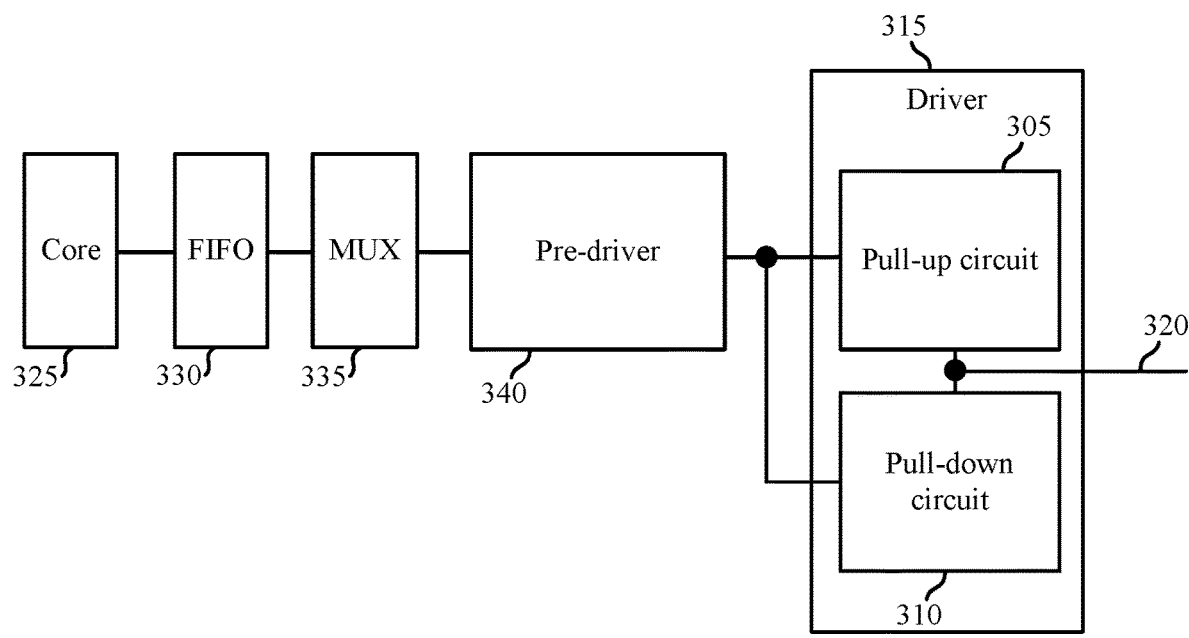
FIG. 3 illustrates an example of a transmission circuit that supports an output driver for multi-level signaling in accordance with embodiments of the present disclosure.

FIG. 3 illustrates an example of a transmission circuit 300 in accordance with various embodiments of the present disclosure. The transmission circuit 300 may be configured to generate a multi-level signal or a binary-level signal based on a one or more bits of data. The transmission circuit 300 may be an example of the driver 125 as described with reference to FIG. 1. The transmission circuit 300 may include a driver 315, a first-in first-out (FIFO) component 330, a multiplexer 335, and a pre-driver 340.

The driver 315 may include a pull-up circuit 305 and a pull-down circuit 310. The transmission circuit 300 may be configured to output a signal to a plurality of channels (e.g., channels 115 described with reference to FIG. 1) based on a logic state received from the memory core 325. In some examples, the transmission circuit 300 may be coupled with memory core 325, which may be an example of a controller 110 or an array of memory cells 105 of memory cells as described with reference to FIG. 1.

In some examples, the transmission circuit 300 may operate based on data received from memory core 325. In some examples, the identified data may include one or more bits of information. In other examples, the transmission circuit 300 or the memory controller may identify a desired amplitude level based on the identified data. The transmission circuit 300 or the memory controller may identify a current amplitude level of the output signal of the transmission circuit 300 and, in some examples, the transmission circuit 300 or the memory controller may determine a set of instructions for the pull-up circuit 305 and/or the pull-down circuit 310 to transition from the current amplitude level to the desired amplitude level of the output signal. Additionally or alternatively, for example, the instructions may include characteristics of gate voltages (e.g., amplitude of gate voltages, timing of gate voltages, and/or pattern of gate voltage activation) to apply to one or more switching components that couple an output 320 of the driver 315 to two or more voltage sources. The instructions may be configured to cause the output signal to be "pulled-up" or "pulled down" to the desired amplitude level.

In some examples, memory core 325 may be coupled with the FIFO component 330. For example, the data transmitted from memory core 325 may be routed through FIFO component 330. FIFO component 330 may, for example, organize and/or manipulate the data transmitted from memory core 325. In some examples, FIFO component 330 may manipulate and/or organize the data according to time and prioritization. Thus FIFO component 330 may process data on a first-come, first-served basis. In some examples, FIFO component 330 may utilize a same clock as a memory controller (e.g., controller 110 as described with reference to FIG. 1). In other examples, FIFO component 330 may utilize separate clocks for reading and writing operations.

In other examples, data transmitted from memory core 325 and through FIFO component 330 may be multiplexed via a multiplexer 335. Multiplexer 335 may be coupled with both memory core 325 and FIFO component 330. In some examples, the multiplexer 335 may select one of several input signals received from FIFO component 330. Upon selecting an input signal, the multiplexer 335 may forward the signal to pre-driver 340. Pre-driver 340, for example, may be coupled with multiplexer 335 and may utilize a biasing circuit to generate a low-power signal. In some examples, the signal generated via pre-driver 340 may be transmitted to pull-up circuit 305 and/or pull-down circuit 310. In some cases, the pre-driver 340 may include one or more invertors tied to the output of the multiplexer 335 to generate gate signals for switching components of the driver 315.

The pull-up circuit 305 may be configured to bias an output signal of the driver 315 from a first amplitude to a second amplitude that is greater than the first amplitude. For example, if the output signal is at a first amplitude 205-b as described with reference to FIG. 2, the pull-up circuit 305 may be used to transition the output signal to either of amplitudes 205-c or 205-d. The pull-up circuit 305 may be coupled to a first voltage source using one or more switching components (e.g., a transistor). The first voltage source may have a greater voltage than a second voltage source associated with the pull-down circuit 310.

The pull-down circuit 310 may be configured to bias an output signal of the driver 315 from a first amplitude to a second amplitude that is less than the first amplitude. For example, if the output signal is of a first amplitude 205-b, as described with reference to FIG. 2, the pull-down circuit 310 may be used to transition the output signal to amplitude 205-a. The pull-down circuit 310 may be coupled to a second voltage source using one or more switching components (e.g., a transistor). The second voltage source may have a lesser voltage than the first voltage source associated with the pull-up circuit 305. In some cases, the pull-down circuit 310 selectively couples the output of the driver 315 with a ground or virtual ground.

In some cases, the design of the pull-up circuit 305 and/or the pull-down circuit 310 may affect various characteristics of the output signal as represented by an eye diagram (e.g., eye diagram 200 as described with reference to FIG. 2). For example, the design of the pull-up circuit 305 and/or the pull-down circuit 310 may affect eye width (e.g., width 220 as described with reference to FIG. 2), eye opening (e.g., eye opening 245 as described with reference to FIG. 2), distortion (e.g., distortion 250 as described with reference to FIG. 2), jitter (e.g., jitter 240 as described with reference to FIG. 2), the location of the amplitude(s), other characteristics, or combinations thereof.

In some cases, the transmission circuit 300 may be configured to selectively generate binary signals (e.g., NRZ signaling) or multi-level signals (e.g., PAM4 or PAM8). In other examples, the transmission circuit 300 may be configured to adjust a transmit power of the output signal of the driver 315. Additionally or alternatively, for example, the transmission circuit 300 or a memory controller (e.g., controller 110 as described with reference to FIG. 1) may be configured to select one or more channels or one or more groups of channels to communicate the output signal to another component of the memory device. In some cases, a plurality of drivers may be used to generate a multi-level signal (e.g., a PAM4 signal) across a channel. The plurality of drivers may be configured to cooperate to generate the multi-level signal based on commands received from a controller.

Figure 4:
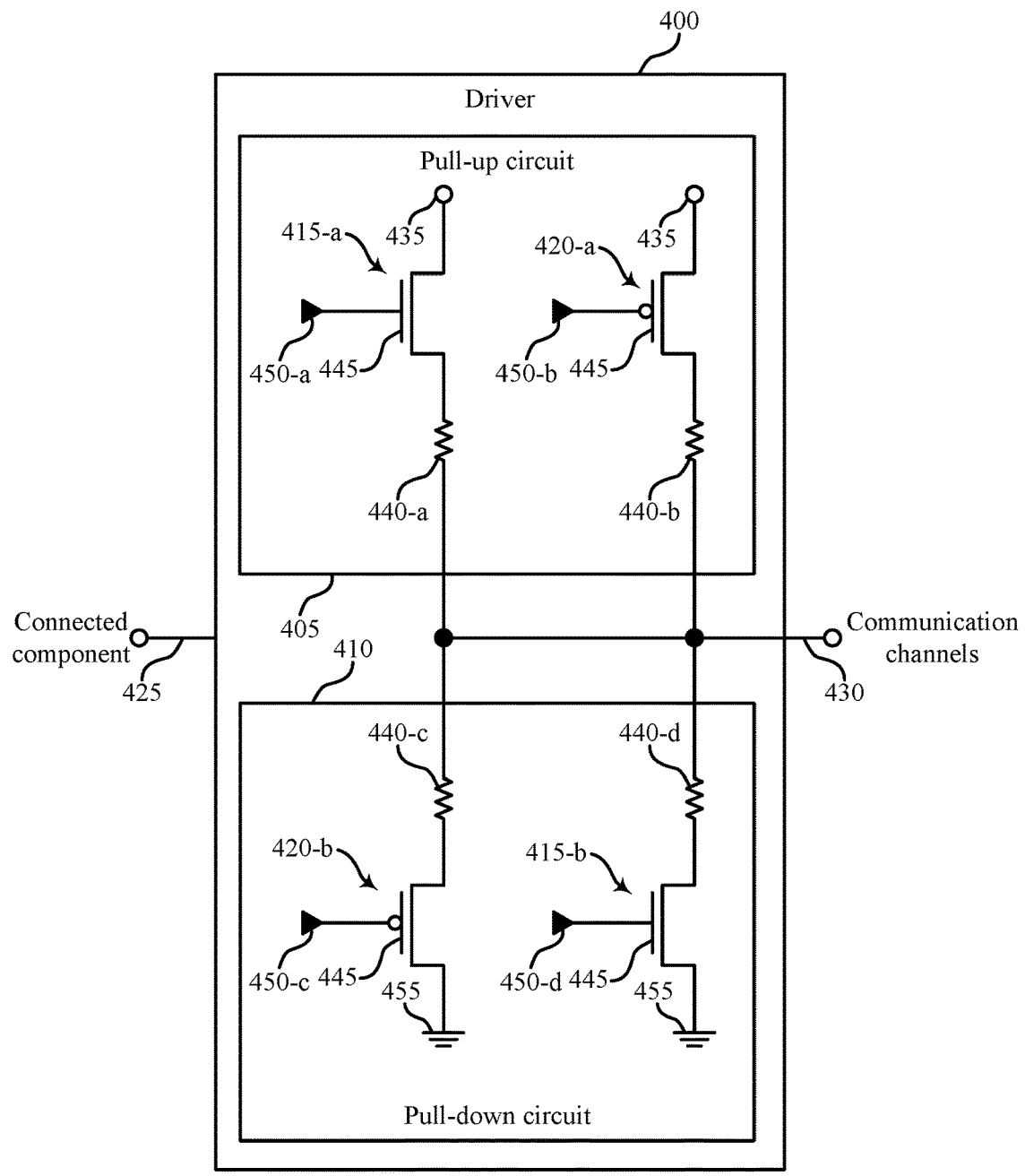
FIG. 4 illustrates an example of a driver that supports an output driver for multi-level signaling in accordance with embodiments of the present disclosure.

FIG. 4 illustrates an example of a driver 400 that supports an output driver for multi-level signaling in accordance with various embodiments of the present disclosure. The driver 400 may be an example of a multi-level signal driver. The driver 400 may include a pull-up circuit 405 and a pull-down circuit 410. The driver 400 shows examples of circuits 405, 410 that include a first switching component 415 of a first polarity and a second switching component 420 of a second polarity that is opposite the first polarity. Using two switching components of opposite polarity in a multi-level driver 400 may improve one or more characteristics of a multi-level signal output to one or more communication channels (e.g., channels 115). The driver 400 may be an example of drivers 125, 315 described with reference to FIGS. 1 and 3. The pull-up circuit 405 may be an example of the pull-up circuit 305 described with reference to FIG. 3. The pull-down circuit 410 may be an example of the pull-down circuit 310 described with reference to FIG. 3.

The driver 400 may have an input 425 coupled with a connected component from which the driver 400 may receive data (e.g., a plurality of bits) that is to be transmitted or commands for generating a multi-level signal based on a plurality of bits. The connected component may refer to a controller (e.g., controller 110) or a different more granular component such as a pre-driver, a multiplexer, a FIFO component, a memory core, or a combination thereof. In some cases, the input 425 may receive gate signals for the switching components 415, 420 from a controller. The driver 400 may have an output 430 coupled with one or more communication channels (e.g., channels 115) from which the driver 400 outputs a multi-level signal.

The pull-up circuit 405 may include a first switching component 415-a having a first polarity and a second switching component 420-a having a second polarity opposite the first polarity. For example, the first switching component 415-a may be an example of a positive metal-oxide semiconductor (pmos) transistor and the second switching component 420-a may be an example of a negative metal-oxide semiconductor (nmos) transistor.

The switching components 415-a, 420-a may couple the output 430 of the driver 400 with a voltage source 435. In some cases, the switching components 415-a, 420-a may be arranged in a parallel configuration such that the first switching component 415-a may be coupled with the output 430 and the voltage source 435 in parallel to the second switching component 420-a. The voltage source 435 may be an example of a positive voltage source (e.g., Vdd) in the memory device.

The pull-up circuit 405 may include one or more resistors 440 positioned in series with a switching component 415-a, 420-a between the voltage source 435 and the output 430. In some cases, the values of the resistors 440 and/or the switching components 415-a, 420-a may be set or adjusted to vary characteristics of the multi-level signal output by the driver 400. The resistors 440 may be positioned either between their respective switching component and the output 430 or between their respective switching component and the voltage source 435.

The switching components 415-a, 420-a may include a gate 445 that receives a gate signal 450 from a controller or another connected component. In some cases, the gate signals 450 for each switching component 415, 420 may be independently controlled. In some cases, the gate signals 450 for switching components 415 of the first polarity are independently controlled from the switching components 420 of the second polarity. In some cases, the gate signal 450-a for the first switching component 415-a may be the complement of the gate signal 450-b for the second switching component 420-a. In some cases, the first switching component 415-a may be activated before or after the second switching component 420-a is activated such that the timing of the two switching components is offset. In some cases, the first switching component 415-a may be activated for a first time period that overlaps with the second time period during which the second switching component 420-a is activated.

The pull-up circuit 405 may be configured to raise (or "pull-up") the amplitude of the multi-level signal from a current level to a target level higher than the current level. A controller may be configured to selectively activate the switching components 415-a, 420-a thereby coupling the voltage source 435 with the output 430.

A controller or the driver 400 may identify data to be transmitted to another component of a memory device. Before generating the multi-level signal, the controller or the driver 400 may identify a target amplitude of the multi-level signal and/or a current amplitude level of the multi-level signal. The controller or the driver 400 may determine whether the current amplitude should be raised or lowered to reach the target amplitude. The controller or the driver 400 may determine one or more driver parameters for operating the driver 400 to generate the desired multi-level signal. Examples of the one or more driver parameters may include a timing for activating a pull-up circuit 405 or a pull-down circuit 410 or a combination of both, gate voltages for activating switching components of the pull-up circuit 405 and/or the pull-down circuit 410, how many switching components 415, 420 of each circuit 405, 410 may be activated (e.g., less than all of the switching components may be activated in a given operation), independent control parameters for the first switching component(s) 415-a of the first polarity and the second switching component(s) 420-a of the second polarity (e.g., different switching components in the pull-up circuit 405 or the pull-down circuit 410 may be independently controlled), or a combination thereof.

In some pull-up circuits, only switching components of a single polarity (e.g., nmos transistors) may be used to couple the output 430 with the voltage source 435. In some cases, however, a relationship between an output voltage and an output current of the driver 400 may not be linear over the entire range of output values of the multi-level signal when using one or more switching components having a single polarity (e.g., see FIG. 8 and its related description). Non-linearity between the output voltage and the output current of the driver may generate unwanted characteristics of the multi-level signal output by the driver 400. For example, a non-linear relationship create distortion in the multi-level signal, overshoot and/or undershoot in the multi-level signal, jitter in the multi-level signal, inconsistent margins between different amplitude levels in the multi-level signal (different eye opening size for each eye), narrower eye widths of each eye of the multi-level signal, varying rise times and/or fall times of the multi-level signal, other undesired effects, or a combination thereof (e.g., see FIG. 9 and its related description).

By coupling a second switching component 420-a of an opposite polarity (e.g., pmos transistor) in parallel with the first switching component 415-a (e.g., nmos transistor), one or more undesired characteristics of the multi-level signal may be mitigated. Some of this effect may be caused at least in part by the relationship between the output voltage and the output current becoming more linear across the range of output voltages of the multi-level signal.

The pull-down circuit 410 may also include a first switching component 415-b having a first polarity and a second switching component 420-b having a second polarity opposite the first polarity. For example, the first switching component 415-b may be an example of a positive metal-oxide semiconductor (pmos) transistor and the second switching component 420-b may be an example of a negative metal-oxide semiconductor (nmos) transistor.

The switching components 415-b, 420-b may couple the output 430 of the driver 400 with a ground 455. In some cases, the ground 455 may be an example of a virtual ground or a voltage source having voltage level (e.g., Vss) that is less than a voltage level of the voltage source 435. In some cases, the switching components 415-b, 420-b may be arranged in a parallel configuration such that the first switching component 415-b may be coupled with the output 430 and the ground 455 in parallel to the second switching component 420-b.

The pull-down circuit 410 may include one or more resistors 440 positioned in series with a switching component 415-b, 420-b between the voltage source 435 and the output 430. In some cases, the values of the resistors 440 and/or the switching components 415-b, 420-b may be set or adjusted to vary characteristics of the multi-level signal output by the driver 400. The resistors 440 may be positioned either between their respective switching component and the output 430 or between their respective switching component and the ground 455.

The pull-down circuit 410 may be operated in a similar manner as the pull-up circuit 405. As such a full description of the operation of the pull-down circuit 410 is not given here. It should be appreciated that operations of the pull-up circuit 405 may be modified when applied to the pull-down circuit 410.

During some operations, the driver 400 may use both the pull-up circuit 405 and the pull-down circuit 410 to reach the target amplitude of the multi-level signal. In such cases, a controller or the driver 400 may determine relative timings for operating pull-up circuit 405 and the pull-down circuit 410 in the same procedure for generating an amplitude of the multi-level signal.

In some cases, a gate 445 of at least one switching component of the pull-up circuit 405 may be coupled to a gate 445 of at least one switching component of the pull-down circuit 410. For example, the gate 445 of the first switching component 415-a of the pull-up circuit 405 may be coupled with the gate 445 of the second switching component 420-b of the pull-down circuit 410. In such examples, the same gate signal 450 may be used to activate/deactivate both the switching components 415-a, 420-b. In some examples, the gate 445 of the second switching component 420-a of the pull-up circuit 405 may be coupled with the gate 445 of the first switching component 415-b of the pull-down circuit 410. In such examples, the same gate signal 450 may be used to activate/deactivate both the switching components 415-b, 420-a.

In one example, a device or system may include an array of memory cells, a controller coupled with the array of memory cells, and a driver coupled with the controller and configured to generate a multi-level signal related to the array of memory cells, the driver including a pull-up circuit including a first switching component having a first gate polarity and a second switching component having a second gate polarity different than the first gate polarity.

In some examples of the device or system described above, the first switching component and the second switching component may be configured to generate a linear output current relative to a output voltage of the first switching component and the second switching component. In some examples of the device or system described above, the first switching component is an example of a pmos transistor and the second switching component is an example of an nmos transistor.

In some examples of the device or system described above, the first switching component and the second switching component may be coupled with a common voltage source and an output node of the driver in parallel.

In some examples of the device or system described above, the driver further includes a pull-down circuit including a third switching component having the first gate polarity and a fourth switching component having the second gate polarity. In some examples of the device or system described above, the third switching component comprises a pmos transistor and the fourth switching component comprises an nmos transistor. In some examples of the device or system described above, the third switching component and the fourth switching component may be coupled with a common ground node and an output node of the driver in parallel.

Some examples of the device or system described above may also include a gate of the first switching component of the pull-up circuit may be coupled with a gate of the fourth switching component of the pull-down circuit. Some examples of the device or system described above may also include a gate of the second switching component of the pull-up circuit may be coupled with a gate of the third switching component of the pull-down circuit.

In some examples of the device or system described above, the multi-level signal may be encoded with information using a PAM modulation scheme, such as PAM4 or PAM8.

Figure 5:
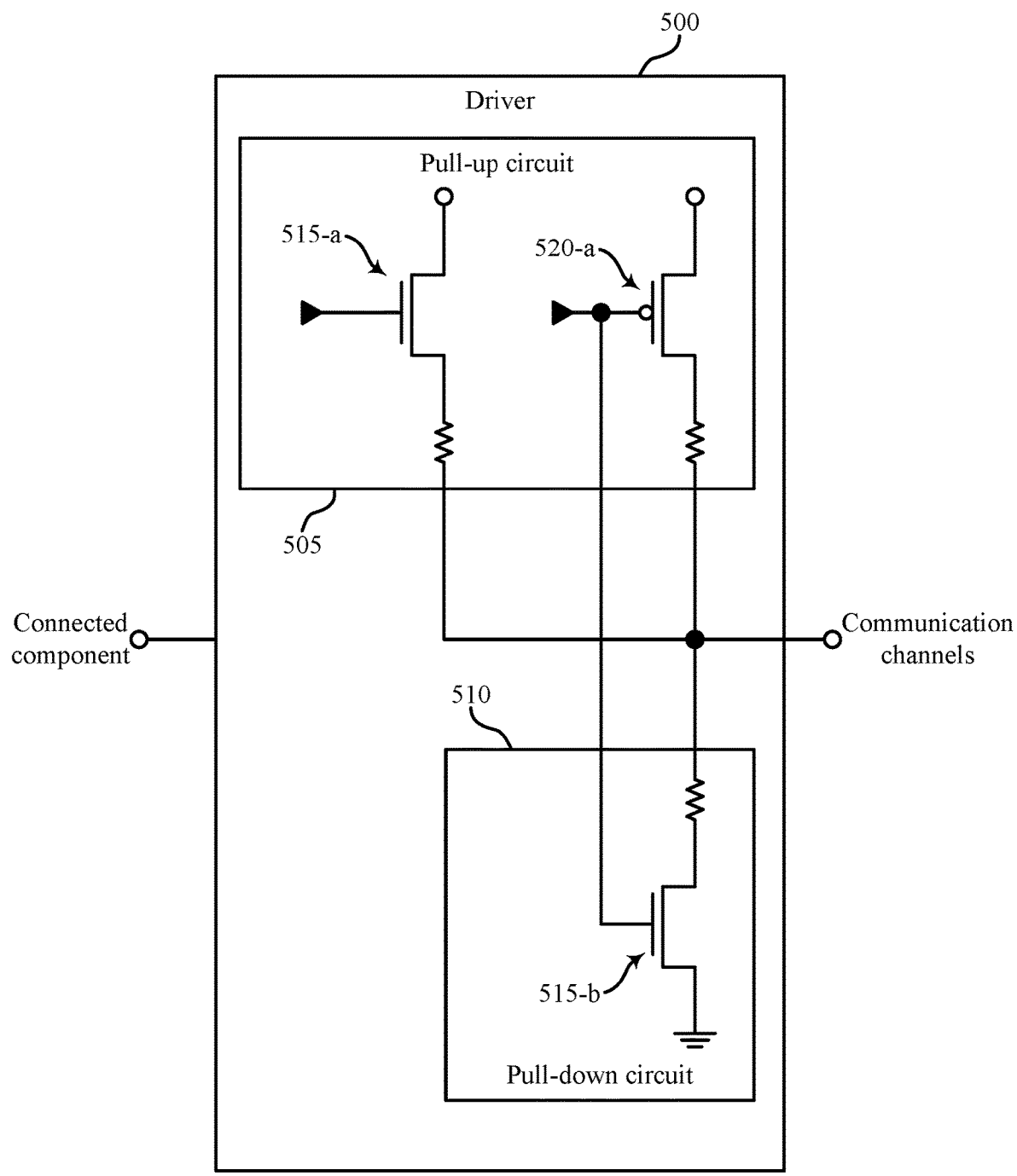
FIG. 5 illustrates an example of a driver that supports an output driver for multi-level signaling in accordance with embodiments of the present disclosure.

FIG. 5 illustrates an example of a driver 500 that supports an output driver for multi-level signaling in accordance with various embodiments of the present disclosure. The driver 500 may be an example of a multi-level signal driver. The driver 500 may include a pull-up circuit 505 and a pull-down circuit 510. The driver 500 shows an example where one of the pull-up circuit 505 or the pull-down circuit 510 includes a first switching component 515-$a$ of a first polarity (e.g., nmos transistor) and a second switching component 520 of a second polarity that is opposite the first polarity (e.g., pmos transistor) and the other one of the pull-up circuit 505 or the pull-down circuit 510 only includes a first switching component 515-$b$ of the first polarity (e.g., nmos transistor). While the driver 500 illustrates the pull-up circuit 505 having one configuration and the pull-down circuit 510 having the other configuration, such configurations may be switched in other implementations. Such a configuration for the driver 500 may use less power and take less die space than the driver 400 while still achieving many of the same desired characteristics of multi-level signal achieved by the driver 400.

The driver 500 may be an example of drivers 125, 315, 400 described with reference to FIGS. 1 and 3-4. The pull-up circuit 505 may be an example of the pull-up circuits 305, 405 described with reference to FIGS. 3-4. The pull-down circuit 510 may be an example of the pull-down circuits 310, 410 described with reference to FIGS. 3-4. As such, a full description of the driver 500, the pull-up circuit 505, the pull-down circuit 510, and their various components is not repeated here.

In some case, a gate of the second switching component 520 of the pull-up circuit 505 may be coupled with a gate of the first switching component 515-$b$ of the pull-down circuit 510. In such cases, the same gate signal may be used to activate/deactivate both the switching components 515-$b$, 520. In this manner, only one of the pull-up circuit 505 or the pull-down circuit 510 may be activated at a time.

Figure 6:
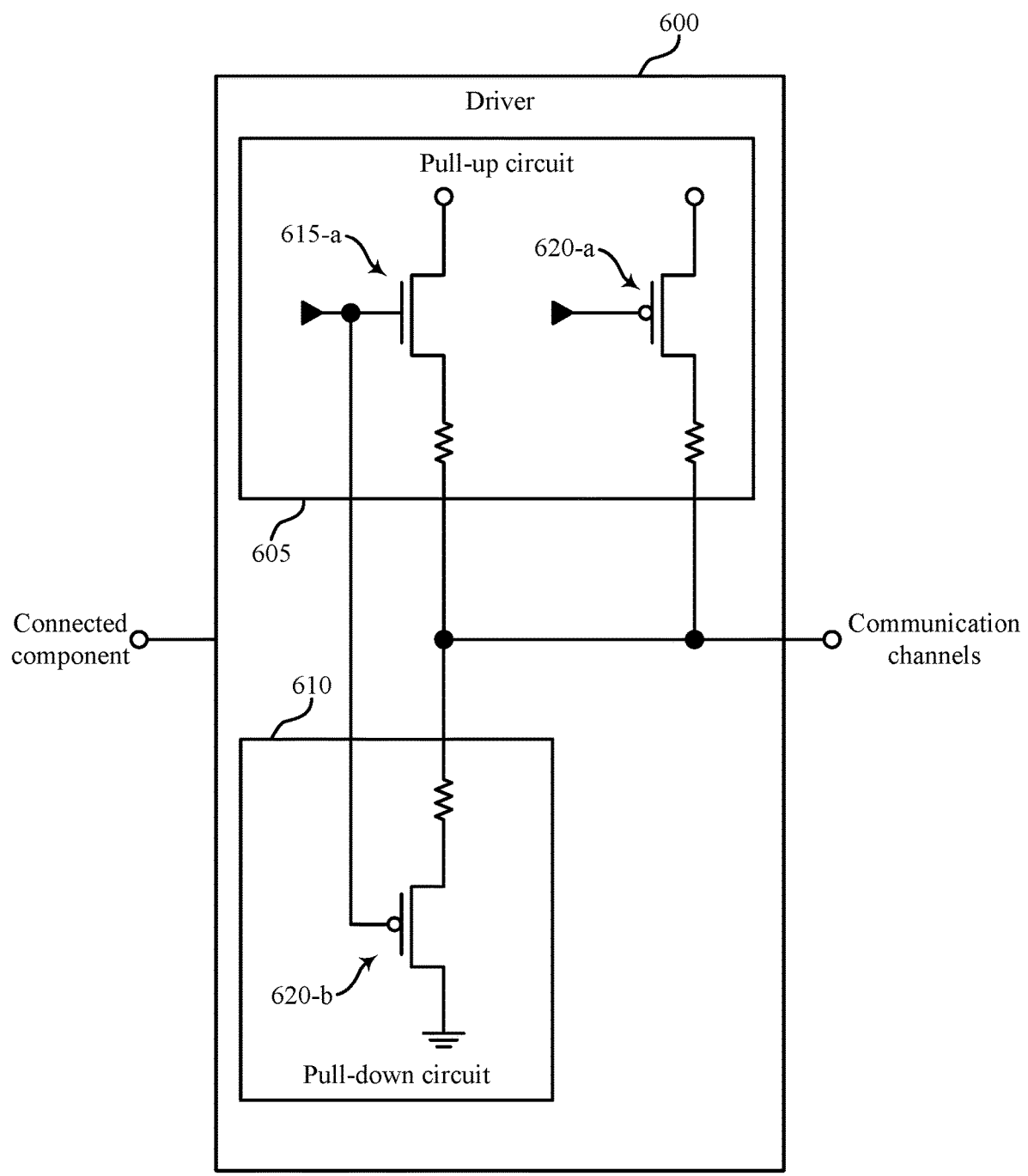
FIG. 6 illustrates an example of a driver that supports an output driver for multi-level signaling in accordance with embodiments of the present disclosure.

FIG. 6 illustrates an example of a driver 600 that supports an output driver for multi-level signaling in accordance with various embodiments of the present disclosure. The driver 600 may be an example of a multi-level signal driver. The driver 600 may include a pull-up circuit 605 and a pull-down circuit 610. The driver 600 shows an example where one of the pull-up circuit 605 or the pull-down circuit 610 includes a first switching component 615 of a first polarity (e.g., nmos transistor) and a second switching component 620-$a$ of a second polarity that is opposite the first polarity (e.g., pmos transistor) and the other one of the pull-up circuit 605 or the pull-down circuit 610 only includes a second switching component 620-$b$ of the second polarity (e.g., pmos transistor). While the driver 600 illustrates the pull-up circuit 605 having one configuration and the pull-down circuit 610 having the other configuration, such configurations may be switched in other implementations. Such a configuration for the driver 600 may use less power and take less die space than the driver 400 while still achieving many of the same desired characteristics of multi-level signal achieved by the driver 400.

The driver 600 may be an example of drivers 125, 315, 400 described with reference to FIGS. 1 and 3-4. The pull-up circuit 605 may be an example of the pull-up circuits 305, 405 described with reference to FIGS. 3-4. The pull-down circuit 610 may be an example of the pull-down circuits 310, 410 described with reference to FIGS. 3-4. As such, a full description of the driver 600, the pull-up circuit 605, the pull-down circuit 610, and their various components is not repeated here.

In some case, a gate of the first switching component 615 of the pull-up circuit 605 may be coupled with a gate of the second switching component 620-$b$ of the pull-down circuit 610. In such cases, the same gate signal may be used to activate/deactivate both the switching components 615, 620-$b$. In this manner, only one of the pull-up circuit 605 or the pull-down circuit 610 may be activated at a time.

Figure 7:
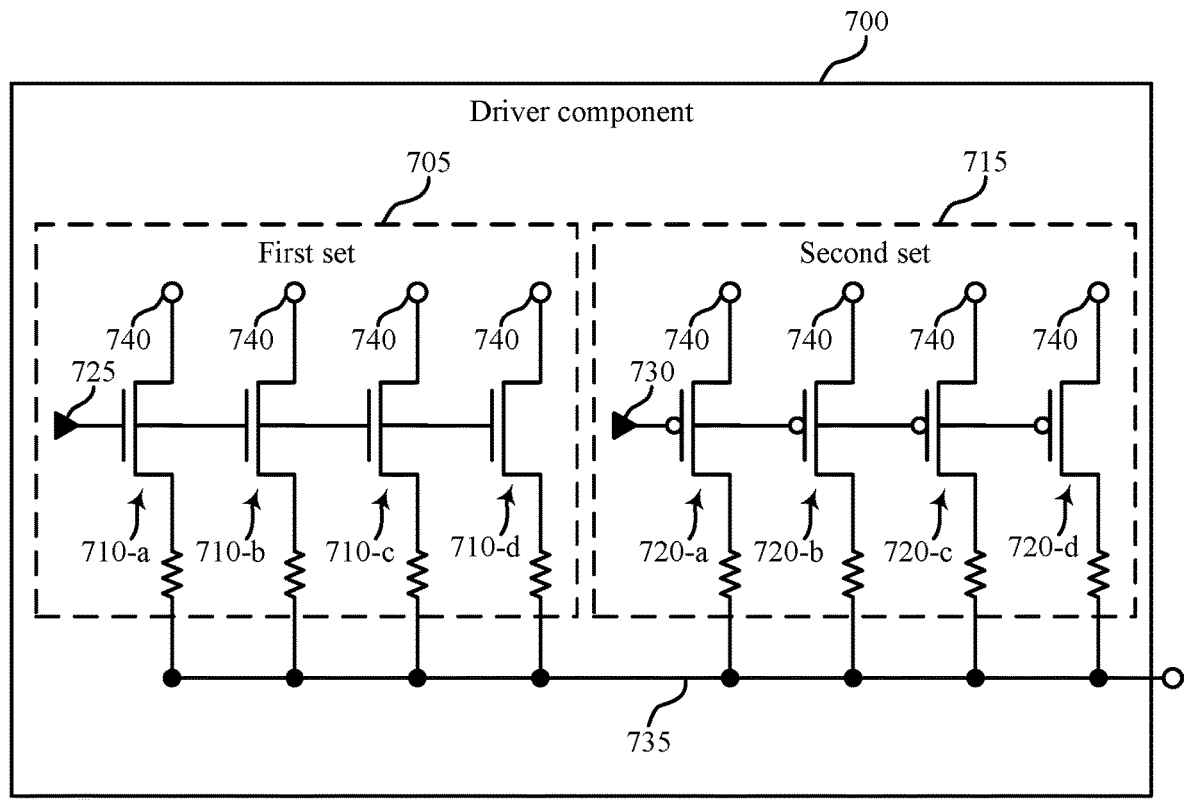
FIG. 7 illustrates an example of a driver component that supports an output driver for multi-level signaling in accordance with embodiments of the present disclosure.

FIG. 7 illustrates an example of a driver component 700 that supports an output driver for multi-level signaling in accordance with various embodiments of the present disclosure. The driver component 700 may be an example of a pull-up circuit (e.g., pull-up circuits 305, 405, 505, 605) or a pull-down circuit (e.g., pull-down circuits 310, 410, 510, 610) of a driver (e.g., driver 125, 315, 400, 500, 600). In each of the drivers 400, 500, 600 described with reference to FIGS. 4-6, the drivers included at most one switching component of a given polarity. The driver component 700 illustrates that a pull-up circuit or a pull-down circuit of a driver may include any number of switching components of a first polarity and any number of switching components of a second polarity.

The driver component 700 may include a first set 705 of switching components 710 having a first polarity and a second set 715 of switching components 720 having a second polarity different from the first polarity. In some cases, the first set 705 has an equal number of switching components as the second set 715. In some cases the first set 705 may have more or less switching components than the second set 715.

In some cases, the gates of the first set 705 of switching components 710 may be coupled such that the first set 705 of switching components 710 may be controlled by a single gate signal 725 from a controller. In some cases, the gates of the second set 715 of switching components 720 may be coupled such that the second set 715 of switching components 720 may be controlled by a single gate signal 730 from a controller. In some cases, the gate signal 725 for the first set 705 may be the complement of the gate signal 730 for the second set 715.

The switching components 710, 720 may couple an output 735 of the driver to a source 740. The source 740 may be a voltage source or ground depending on whether the driver component 700 is implemented as a pull-up circuit or a pull-down circuit. Various features of the driver component 700 may be implemented in a pull-up circuit and a pull-down circuit simultaneously.

In some cases, the number of switching components 710, 720 in a pull-up circuit may be equal to a number of switching components in a pull-down circuit. In some examples, the number of switching components 710 in the first set 705 in a pull-up circuit may be equal to the number of switching components 720 in the second set 715 of the pull-down circuit. In such examples, each switching component 710 of a first polarity in a pull-up circuit may be paired with a switching component 720 of a second polarity in a pull-down circuit, or vice-versa. In some cases, the gates of the switching components 710 of a first polarity in a pull-up circuit may be coupled with the gates of the switching components 720 of a second polarity in a pull-down circuit, or vice-versa. In such cases, a single gate signal may drive at least one switching component 710 in the pull-up circuit and at least one switching component 720 in the pull-down circuit, or vice-versa. In some cases, the gate of each switching component 710, 720 may be independently controlled.

Figure 8:
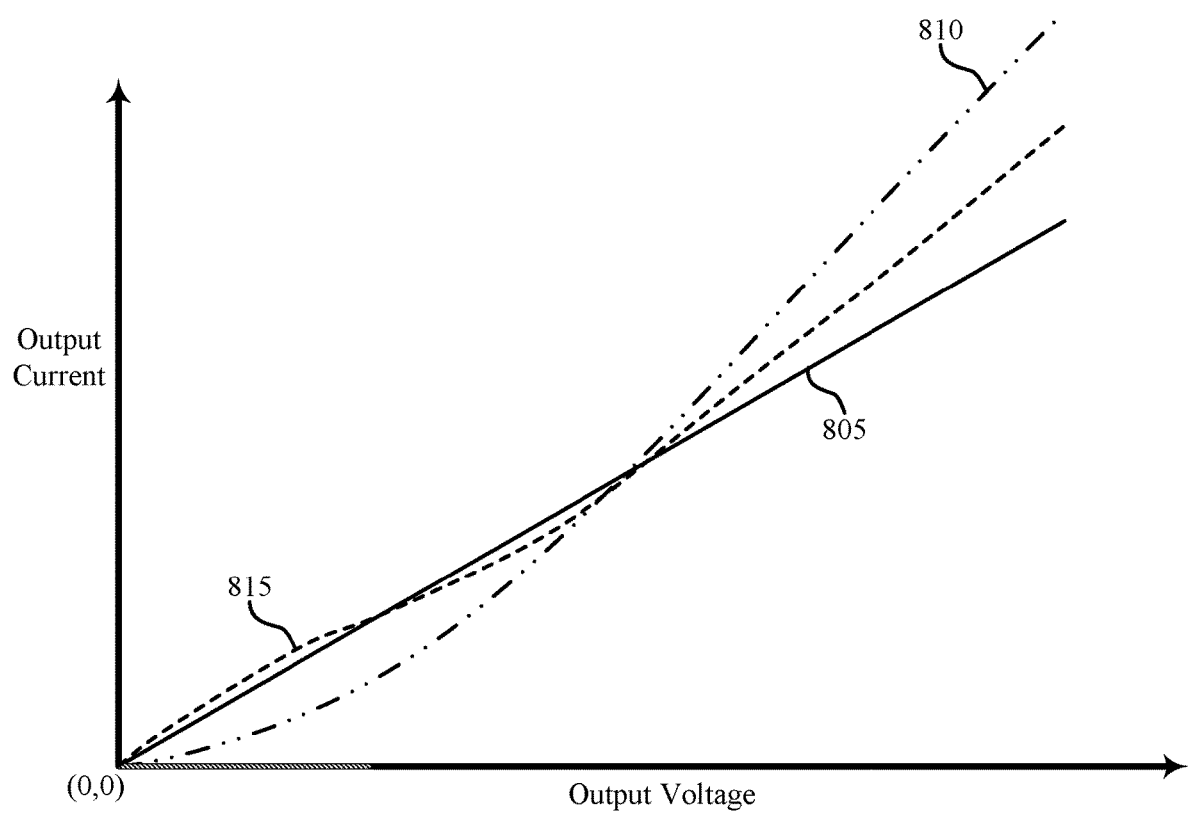
FIG. 8 illustrates an example of an output graph that supports an output driver for multi-level signaling in accordance with embodiments of the present disclosure.

FIG. 8 illustrates an example of an output graph 800 that supports an output driver for multi-level signaling in accordance with various embodiments of the present disclosure. The output graph 800 shows the relationships between output current and output voltage of a driver that includes a pull-up circuit or a pull-down circuit or a combination of the two.

The output graph 800 includes a first curve 805, a second curve 810, and a third curve 815. The first curve shows an ideal linear case. In an ideal output signal the relationship between output current and output voltage across the entire range of output values will be linear. The second curve 810 shows a relationship between output current and output voltage of a driver that includes switching components of a single polarity (e.g., nmos transistors). The third curve 815 shows a relationship between output current and output voltage of driver that includes switching components of a first polarity and switching components of a second polarity opposite the first polarity (e.g., nmos transistors and pmos transistors).

Switching components of the first polarity (e.g., nmos transistors) may have a linear response across a first range of output voltages and a non-linear response across a second rage of output voltages. Switching components of the second polarity (e.g., pmos transistors) may have a linear response across a third range of output voltages and a non-linear response across a fourth range of output voltages. In some cases, the first range and the third range positioned across at least partially different output voltages and the second range and the fourth range are positioned across at least partially different output voltages. In some cases, if a circuit of a driver includes both types of switching components the different types of switching components may cooperate to generate a more linear relationship across a broader range of output voltages than a circuit that includes only one type of switching component.

Figure 9:
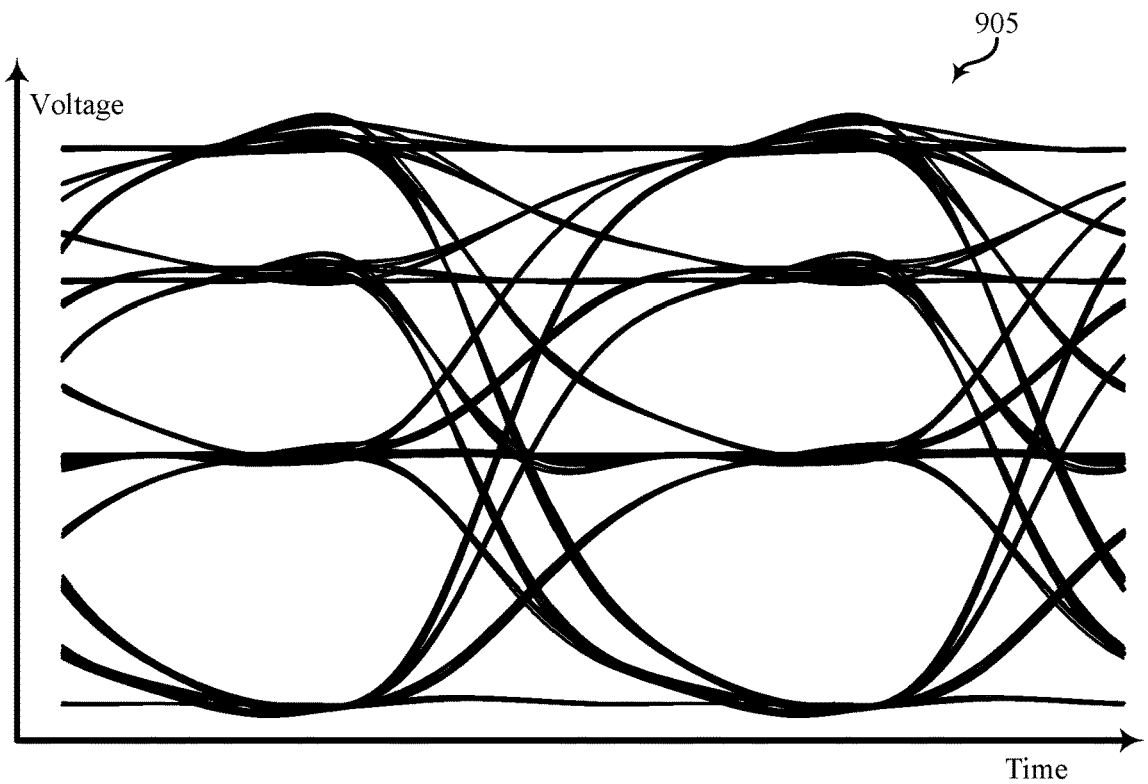
FIG. 9 illustrates an example of eye diagrams that support an output driver for multi-level signaling in accordance with embodiments of the present disclosure.
Figure 9:
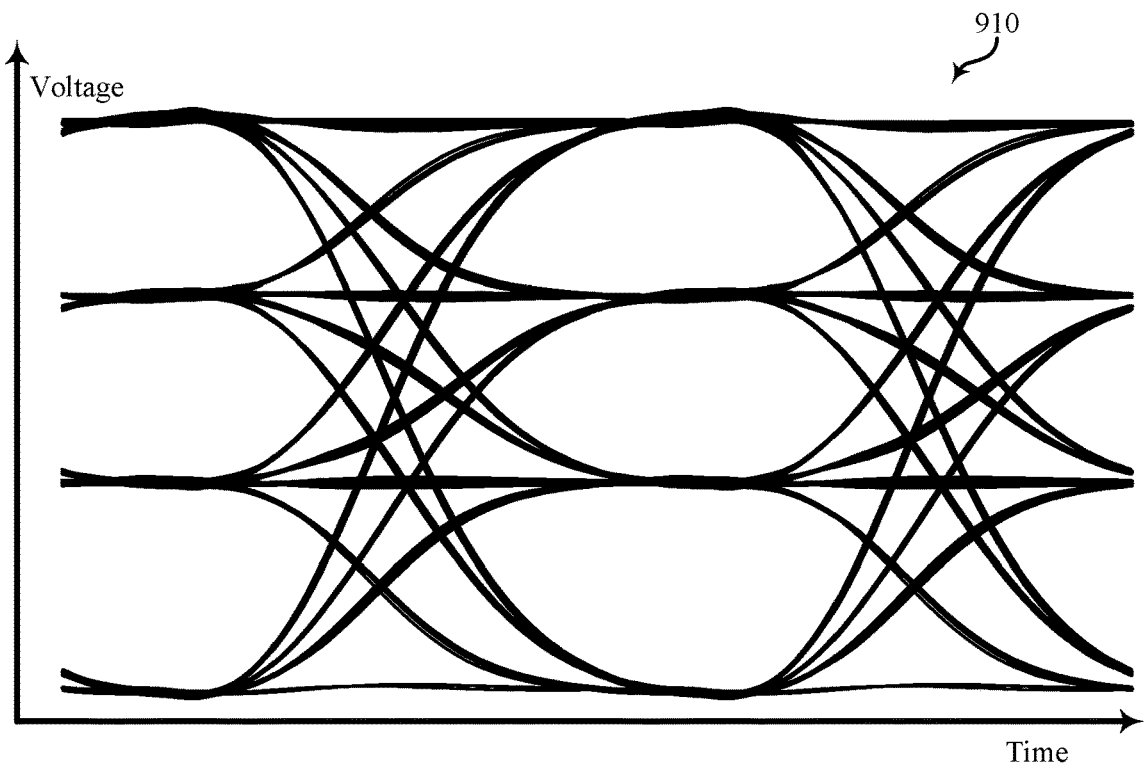

FIG. 9 illustrates examples of eye diagrams 900 that supports an output driver for multi-level signaling in accordance with various embodiments of the present disclosure. The eye diagrams 900 include an eye diagram 905 that represents a multi-level signal modulated using a first modulation scheme having at least three levels generated by a driver whose pull-up and pull-down circuits include switching components of a single polarity (e.g., a single type of transistor). More specifically, the eye diagram 905 represents a multi-level signal modulated using a first modulation scheme having at least three levels generated by a driver whose pull-up and pull-down circuits include only nmos transistors. The eye diagrams 900 also include an eye diagram 910 that represents a multi-level signal modulated using a first modulation scheme having at least three levels generated by a driver whose pull-up and pull-down circuits include switching components of a first polarity and switching components of a second polarity opposite the first polarity. More specifically, the eye diagram 910 represents a multi-level signal modulated using a first modulation scheme having at least three levels generated by a driver whose pull-up and pull-down circuits include nmos transistors and pmos transistors. For example, the eye diagram 910 may represent a signal generated by driver 400 described with reference to FIG. 4.

As is illustrated by a comparison between the eye diagram 905 and the eye diagram 910 having a more linear relationship between output current and output voltage may have a number of desirable effects on a multi-level signal modulated using a first modulation scheme having at least three levels generated by the driver. The effects may include less distortion, less overshoot, less undershoot, more uniform eye openings for all eyes in the eye diagram 910 than eyes in the eye diagram 905 (some openings are smaller and some are bigger), the amplitude levels of the multi-level signal may be spaced more evenly to reduce errors, less jitter, more consistent rise times and/or fall times, wider eyes, other effects, or a combination thereof.

In some cases, the characteristics of the multi-level signal output by a driver may also be influenced by values of the components in the pull-up circuit and/or the pull-down circuit. For example, the characteristics and/or values of the switching components (whether of the first polarity or the second polarity) and/or the resistors (e.g., ohms) may affect the characteristics of the multi-level signal. In some cases, the values of the switching components and the/or the resistors may be designed to achieve desired effects.

Figure 10:
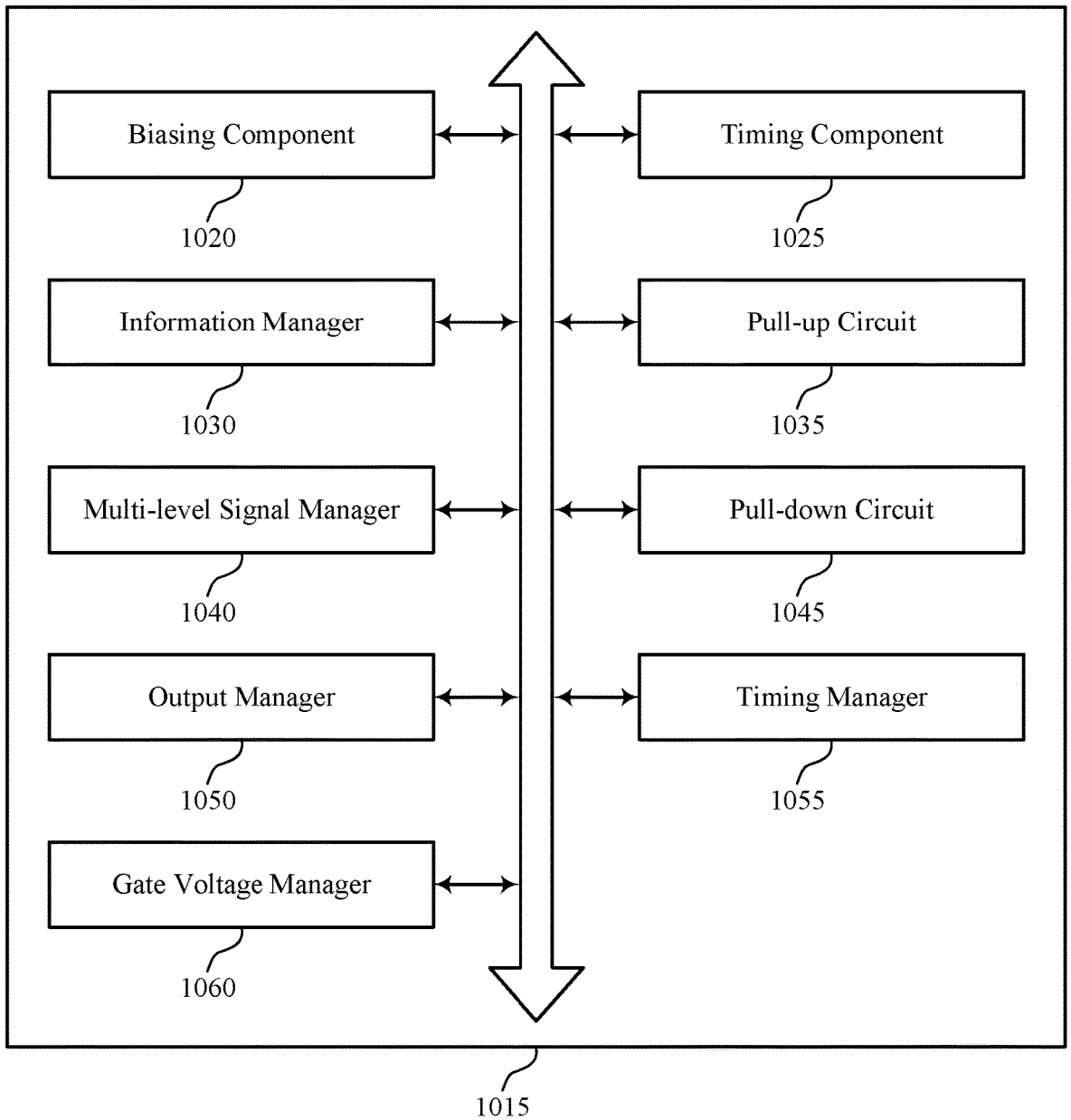
FIG. 10 shows a block diagram of a device that supports an output driver for multi-level signaling in accordance with embodiments of the present disclosure.

FIG. 10 shows a block diagram 1000 of a driver component 1015 that supports an output driver for multi-level signaling in accordance with embodiments of the present disclosure. The driver component 1015 may be an example of a pull-up circuit 305, 405, 505, 605, 700 or a pull-down circuit 310, 410, 510, 610, 700, or both found in a signaling interface 120 described with reference to FIGS. 1 and 2-7.

Driver component 1015 and/or at least some of its various sub-components may be implemented in hardware, software executed by a processor, firmware, or any combination thereof. If implemented in software executed by a processor, the functions of the driver component 1015 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The driver component 1015 and/or at least some of its various sub-components may be physically located at various positions, including being distributed such that portions of functions are implemented at different physical locations by one or more physical devices. In some examples, driver component 1015 and/or at least some of its various sub-components may be a separate and distinct component in accordance with various embodiments of the present disclosure. In other examples, driver component 1015 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

The driver component 1015 may include biasing component 1020, timing component 1025, information manager 1030, pull-up circuit 1035, multi-level signal manager 1040, pull-down circuit 1045, output manager 1050, timing manager 1055, and gate voltage manager 1060. Each of these components may communicate, directly or indirectly, with one another (e.g., via one or more buses). Information manager 1030 may identify a set of information bits to be read from an array of memory cells.

Pull-up circuit 1035 may generate a multi-level signal modulated using a first modulation scheme having at least three levels based on the set of information bits using a driver having a pull-up circuit 1035 including a first switching component having a first gate polarity and a second switching component having a second gate polarity different than the first gate polarity and activate the second switching component during a second time period that overlaps with the first time period. In some cases, generating the multi-level signal further includes: activating the first switching component during a first time period.

Multi-level signal manager 1040 may transmit the multi-level signal to a controller of a memory device, generate a linear output current relative to a output voltage of the first, second, third, and fourth switching components using the first switching component and the second switching component. In some cases, the first switching component and the third switching component are pmos transistors. In some cases, the second switching component and the fourth switching component are nmos transistors.

Pull-down circuit 1045 may activate the fourth switching component during a fourth time period that overlaps with the third time period. In some cases, the driver includes a pull-down circuit 1045 including a third switching component having the first gate polarity and a fourth switching component having the second gate polarity. In some cases, generating the multi-level signal further includes: activating the third switching component during a third time period.

Output manager 1050 may identify an output of the multi-level signal based on the set of information bits, where generating the multi-level signal is based on the identified output.

Timing manager 1055 may determine a timing sequence for activating the pull-up circuit and a pull-down circuit of the driver based on the identified output, where generating the multi-level signal is based on the timing sequence.

Gate voltage manager 1060 may determine a gate voltage for each of the switching components of the driver based on the identified output, where generating the multi-level signal is based on the gate voltage.

Figure 11:
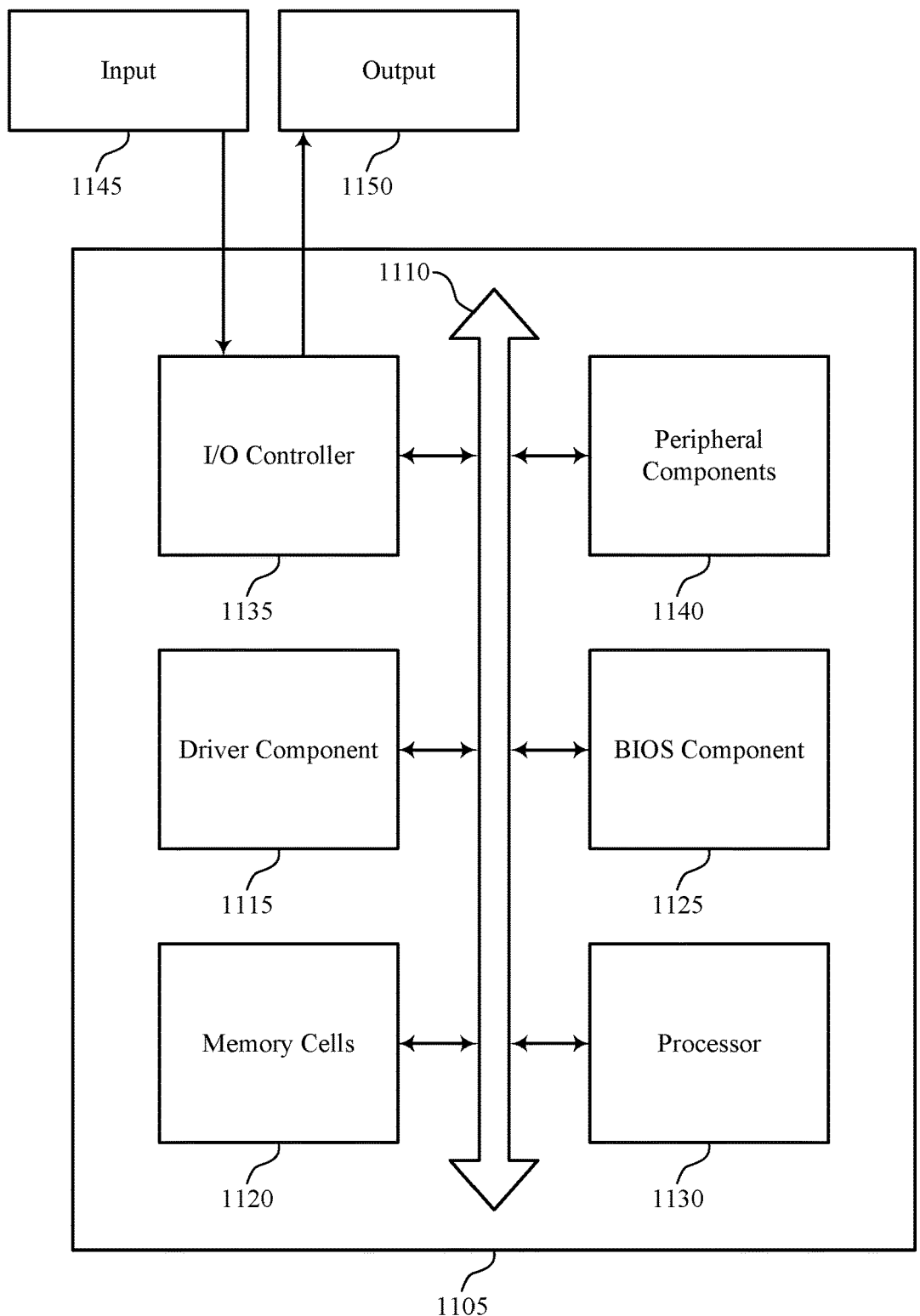
FIG. 11 illustrates a block diagram of a system including a controller that supports an output driver for multi-level signaling in accordance with embodiments of the present disclosure.

FIG. 11 shows a diagram of a system 1100 including a device 1105 that supports an output driver for multi-level signaling in accordance with embodiments of the present disclosure. Device 1105 may be an example of or include the components of controller 110 as described above, e.g., with reference to FIG. 1. Device 1105 may include components for bidirectional voice and data communications including components for transmitting and receiving communications, including driver component 1115, memory cells 1120, basic input/output system (BIOS) component 1125, processor 1130, I/O controller 1135, and peripheral components 1140. These components may be in electronic communication via one or more buses (e.g., bus 1110).

Memory cells 1120 may store information (i.e., in the form of a logical state) as described herein.

BIOS component 1125 be a software component that includes BIOS operated as firmware, which may initialize and run various hardware components. BIOS component 1125 may also manage data flow between a processor and various other components, e.g., peripheral components, input/output control component, etc. BIOS component 1125 may include a program or software stored in read only memory (ROM), flash memory, or any other non-volatile memory.

Processor 1130 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1130 may be configured to operate a memory array using a memory controller. In other cases, a memory controller may be integrated into processor 1130. Processor 1130 may be configured to execute computer-readable instructions stored in a memory to perform various functions (e.g., functions or tasks supporting an output driver for multi-level signaling).

I/O controller 1135 may manage input and output signals for device 1105. I/O controller 1135 may also manage peripherals not integrated into device 1105. In some cases, I/O controller 1135 may represent a physical connection or port to an external peripheral. In some cases, I/O controller 1135 may utilize an operating system such as iOS®, ANDROID®, MS-DOS®, MS-WINDOWS®, OS/2®, UNIX®, LINUX®, or another known operating system. In other cases, I/O controller 1135 may represent or interact with a modem, a keyboard, a mouse, a touchscreen, or a similar device. In some cases, I/O controller 1135 may be implemented as part of a processor. In some cases, a user may interact with device 1105 via I/O controller 1135 or via hardware components controlled by I/O controller 1135.

Peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1145 may represent a device or signal external to device 1105 that provides input to device 1105 or its components. This may include a user interface or an interface with or between other devices. In some cases, input 1145 may be managed by I/O controller 1135, and may interact with device 1105 via a peripheral component 1140.

Output 1150 may also represent a device or signal external to device 1105 configured to receive output from device 1105 or any of its components. Examples of output 1150 may include a display, audio speakers, a printing device, another processor or printed circuit board, etc. In some cases, output 1150 may be a peripheral element that interfaces with device 1105 via peripheral component(s) 1140. In some cases, output 1150 may be managed by I/O controller 1135

The components of device 1105 may include circuitry designed to carry out their functions. This may include various circuit elements, for example, conductive lines, transistors, capacitors, inductors, resistors, amplifiers, or other active or inactive elements, configured to carry out the functions described herein. Device 1105 may be a computer, a server, a laptop computer, a notebook computer, a tablet computer, a mobile phone, a wearable electronic device, a personal electronic device, or the like. Or device 1105 may be a portion or aspect of such a device.

Figure 12:
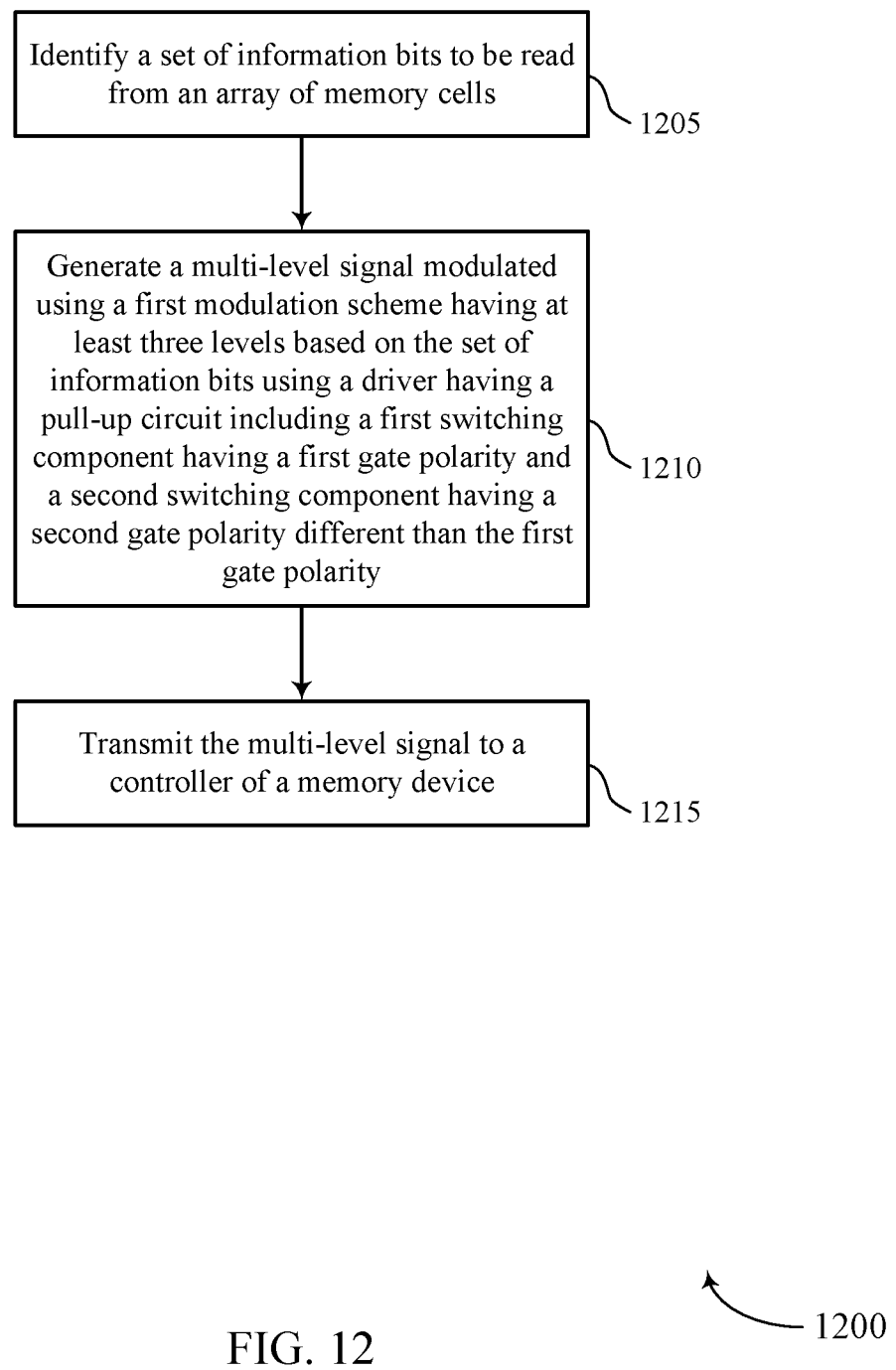
FIG. 12 illustrates a method for an output driver for multi-level signaling in accordance with embodiments of the present disclosure.

FIG. 12 shows a flowchart illustrating a method 1200 for an output driver for multi-level signaling in accordance with embodiments of the present disclosure. The operations of method 1200 may be implemented by a controller 110 or its components as described herein. For example, the operations of method 1200 may be performed by a driver component as described with reference to FIG. 10. In some examples, a controller 110 may execute a set of codes to control the functional elements of the device to perform the functions described below. Additionally or alternatively, the controller 110 may perform aspects of the functions described below using special-purpose hardware.

At block 1205 the controller 110 may identify a plurality of information bits to be read from an array of memory cells. The operations of block 1205 may be performed according to the methods described herein. In certain examples, aspects of the operations of block 1205 may be performed by an information manager as described with reference to FIG. 10.

At block 1210 the controller 110 may generate a multi-level signal modulated using a first modulation scheme having at least three levels based at least in part on the plurality of information bits using a driver having a pull-up circuit including a first switching component having a first gate polarity and a second switching component having a second gate polarity different than the first gate polarity. The operations of block 1210 may be performed according to the methods described herein. In certain examples, aspects of the operations of block 1210 may be performed by a pull-up circuit as described with reference to FIG. 10.

At block 1215 the controller 110 may transmit the multi-level signal to a controller of a memory device. The operations of block 1215 may be performed according to the methods described herein. In certain examples, aspects of the operations of block 1215 may be performed by a multi-level signal manager as described with reference to FIG. 10.

In some cases, the method 1200 may be at least partially executed by an apparatus. The apparatus may include means for identifying a plurality of information bits to be read from an array of memory cells, means for generating a multi-level signal modulated using a first modulation scheme having at least three levels based at least in part on the plurality of information bits using a driver having a pull-up circuit including a first switching component having a first gate polarity and a second switching component having a second gate polarity different than the first gate polarity, and means for transmitting the multi-level signal to a controller of a memory device.

In some cases, the method 1200 may be at least partially executed by another apparatus. The apparatus may include a processor, memory in electronic communication with the processor, and instructions stored in the memory. The instructions may be operable to cause the processor to identify a plurality of information bits to be read from an array of memory cells, generate a multi-level signal modulated using a first modulation scheme having at least three levels based at least in part on the plurality of information bits using a driver having a pull-up circuit including a first switching component having a first gate polarity and a second switching component having a second gate polarity different than the first gate polarity, and transmit the multi-level signal to a controller of a memory device.

In some cases, the method 1200 may be at least partially executed by a non-transitory computer readable medium. The non-transitory computer-readable medium may include instructions operable to cause a processor to identify a plurality of information bits to be read from an array of memory cells, generate a multi-level signal modulated using a first modulation scheme having at least three levels based at least in part on the plurality of information bits using a driver having a pull-up circuit including a first switching component having a first gate polarity and a second switching component having a second gate polarity different than the first gate polarity, and transmit the multi-level signal to a controller of a memory device.

In some examples of the method, apparatus, and non-transitory computer-readable medium described above, the driver includes a pull-down circuit including a third switching component having the first gate polarity and a fourth switching component having the second gate polarity.

In some examples of the method, apparatus, and non-transitory computer-readable medium described above, generating the multi-level signal further comprises: activating the first switching component during a first time period. Some examples of the method, apparatus, and non-transitory computer-readable medium described above may further include processes, features, means, or instructions for activating the second switching component during a second time period that overlaps with the first time period.

In some examples of the method, apparatus, and non-transitory computer-readable medium described above, generating the multi-level signal further comprises: activating the third switching component during a third time period. Some examples of the method, apparatus, and non-transitory computer-readable medium described above may further include processes, features, means, or instructions for activating the fourth switching component during a fourth time period that overlaps with the third time period.

Some examples of the method, apparatus, and non-transitory computer-readable medium described above may further include processes, features, means, or instructions for generating a linear output current relative to a output voltage of the first, second, third, and fourth switching components using the first switching component and the second switching component.

In some examples of the method, apparatus, and non-transitory computer-readable medium described above, the first switching component and the third switching component may be pmos transistors. In some examples of the method, apparatus, and non-transitory computer-readable medium described above, the second switching component and the fourth switching component may be nmos transistors.

Some examples of the method, apparatus, and non-transitory computer-readable medium described above may further include processes, features, means, or instructions for identifying an output of the multi-level signal based at least in part on the plurality of information bits, wherein generating the multi-level signal may be based at least in part on the identified output.

Some examples of the method, apparatus, and non-transitory computer-readable medium described above may further include processes, features, means, or instructions for determining a timing sequence for activating the pull-up circuit and a pull-down circuit of the driver based at least in part on the identified output, wherein generating the multi-level signal may be based at least in part on the timing sequence.

Some examples of the method, apparatus, and non-transitory computer-readable medium described above may further include processes, features, means, or instructions for determining a gate voltage for each of the switching components of the driver based at least in part on the identified output, wherein generating the multi-level signal may be based at least in part on the gate voltage.

In one example, a device or system may include a driver having a pull-up circuit and a pull-down circuit, the pull-up circuit including a first switching component having a first gate polarity and a second switching component having a second gate polarity different than the first gate polarity, the pull-down circuit including a third switching component having the first gate polarity and a fourth switching component having the second gate polarity, an array of memory cells configured to: identify a plurality of information bits to be read from the array of memory cells, generate a multi-level signal modulated using a first modulation scheme having at least three levels based at least in part on the plurality of information bits using the pull-up circuit and the pull-down circuit of the driver, and transmit the multi-level signal to the controller.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
identifying a plurality of information bits to be read from an array of memory cells;
generating a multi-level signal modulated using a first modulation scheme having at least three levels based at least in part on the plurality of information bits using a driver having a pull-up circuit including a first switching component having a first gate polarity and a second switching component having a second gate polarity different than the first gate polarity; and
transmitting the multi-level signal to a controller of a memory device.

2. The method of claim 1, wherein generating the multi-level signal further comprises:
activating the first switching component during a first time period; and
activating the second switching component during a second time period that overlaps with the first time period.

3. The method of claim 1, wherein the driver includes a pull-down circuit including a third switching component having the first gate polarity and a fourth switching component having the second gate polarity.

4. The method of claim 3, wherein generating the multi-level signal further comprises:
activating the third switching component during a third time period; and
activating the fourth switching component during a fourth time period that overlaps with the third time period.

5. The method of claim 3, further comprising:
generating a linear output current relative to an output voltage of the first, second, third, and fourth switching components using the first switching component and the second switching component.

6. The method of claim 3, wherein:
the first switching component and the third switching component are pmos transistors; and
the second switching component and the fourth switching component are nmos transistors.

7. The method of claim 1, further comprising:
identifying an output of the multi-level signal based at least in part on the plurality of information bits, wherein generating the multi-level signal is based at least in part on the identified output.

8. The method of claim 7, further comprising:
determining a timing sequence for activating the pull-up circuit and a pull-down circuit of the driver based at least in part on the identified output, wherein generating the multi-level signal is based at least in part on the timing sequence.

9. The method of claim 7, further comprising:
determining a gate voltage for each switching component of the driver based at least in part on the identified output, wherein generating the multi-level signal is based at least in part on the gate voltage.

* * * * *